(12) United States Patent
Niemeyer

(10) Patent No.: US 10,921,368 B2
(45) Date of Patent: Feb. 16, 2021

(54) TESTING AND CALIBRATION OF A CIRCUIT ARRANGEMENT

(71) Applicant: BOEHRINGER INGELHEIM VETMEDICA GMBH, Ingelheim am Rhein (DE)

(72) Inventor: Axel Niemeyer, Ingelheim am Rhein (DE)

(73) Assignee: BOEHRINGER INGELHEIM VETMEDICA GMBH, Ingelheim am Rhein (DE)

( * ) Notice: Subject to any disclaimer, the term of this patent is extended or adjusted under 35 U.S.C. 154(b) by 259 days.

(21) Appl. No.: 16/144,445

(22) Filed: Sep. 27, 2018

(65) Prior Publication Data

US 2019/0101584 A1   Apr. 4, 2019

(30) Foreign Application Priority Data

Sep. 29, 2017  (EP) .................................... 17020448

(51) Int. Cl.
*G01R 31/28* (2006.01)
*G01R 19/252* (2006.01)
(Continued)

(52) U.S. Cl.
CPC ......... *G01R 31/2839* (2013.01); *G01R 19/12* (2013.01); *G01R 19/252* (2013.01); *H02H 1/0007* (2013.01); *H02H 3/08* (2013.01)

(58) Field of Classification Search
CPC .. G01R 31/2839; G01R 19/12; G01R 19/252; H02H 1/0007; H02H 3/08
See application file for complete search history.

(56) References Cited

U.S. PATENT DOCUMENTS

| 3,711,779 A | 1/1973 | Allington |
| 4,199,728 A | 4/1980 | Carpenter |

(Continued)

FOREIGN PATENT DOCUMENTS

| DE | 10221885 A1 | 12/2003 |
| EP | 1 636 599 B1 | 5/2007 |

(Continued)

OTHER PUBLICATIONS

Paeschke et al.: "Voltammetric Multichannel Measurements Using Silicon Fabricated Microelectrode Arrays", Electroanalysis, vol. 8, No. 10, 1996, pp. 891-898.

(Continued)

*Primary Examiner* — Jue Zhang
(74) *Attorney, Agent, or Firm* — David S. Safran; Roberts Calderon Safran & Cole, P.C.

(57) ABSTRACT

A method and a circuit arrangement for testing and/or calibration, the circuit arrangement having a sensor electrode and a first and second circuit unit coupled thereto, the second circuit unit having a capacitor, and the sensor electrode being kept at a specified electrical target potential by the capacitor and the sensor electrode being coupled such that matching of the electrical potential is made possible. The second circuit unit is configured such that, if the electrical potential of the capacitor is outside a reference range, second circuit unit detects this event and brings the capacitor to a reference potential. For the purpose of testing and/or calibration, a reference current source is provided for injecting an adjustable reference current into the sensor electrode, a reference current injected into another circuit unit is measured, and/or a reference current is injected into different portions of the sensor electrode.

20 Claims, 8 Drawing Sheets

(51) Int. Cl.
    *G01R 19/12*     (2006.01)
    *H02H 1/00*     (2006.01)
    *H02H 3/08*     (2006.01)

(56) References Cited

U.S. PATENT DOCUMENTS

| | | | | |
|---|---|---|---|---|
| 8,232,813 | B2* | 7/2012 | Burdett | G01N 27/404 |
| | | | | 324/713 |
| 2005/0068046 | A1 | 3/2005 | Frey et al. | |
| 2007/0080060 | A1 | 4/2007 | Frey et al. | |
| 2009/0206847 | A1* | 8/2009 | Nohammer | G01N 27/3276 |
| | | | | 324/663 |
| 2009/0308741 | A1 | 12/2009 | Frey et al. | |
| 2017/0146479 | A1* | 5/2017 | Levine | C12Q 1/6825 |

FOREIGN PATENT DOCUMENTS

| | | |
|---|---|---|
| WO | 03067238 A2 | 8/2003 |
| WO | 2005116244 A1 | 12/2005 |

OTHER PUBLICATIONS

Van Gerwen et al.: "Nanoscaled Interdigitated Electrode Arrays for Biochemical Sensors", IEEE, International Conference on Solid-State Sensors and Actuators, Jun. 16-19, 1997, Chicago, USA, 1997, pp. 907-910.

Hintsche et al.: "Microbiosensors using Electrodes made in Si-technology", Frontiers in Biosensorics, Fundamental Aspects, 1997, Scheller, F. W., Schubert, F., Fedrowitz, J. (eds.), Birkhauser Verlag Basel, Switzerland, pp. 267-283.

Uster et al.: "Integrating ADC Using a Single Transistor as Integrator and Amplifier for Very Low (1 fA Minimum) Input Currents", Advanced A/D and D/A Conversion Techniques and Their Applications, Conference at the University of Strathclyde (UK) Jul. 27-28, 1999, Conference Publication No. 466, pp. 86-89, IET.

Breten et al.: "Integrating data converter for picoampere currents from electrochemical transducers", ISCAS 2000, IEEE International Symposium on Circuits and Systems, May 28-31, 2000, Geneva, Switzerland, pp. 709-712.

Thewes et al.: "Sensor arrays for fully-electronic DNA detection on CMOS", Solid-State Circuits Conference, IEEE International, Feb. 3-7, 2002, San Francisco, USA, pp. 350-473.

* cited by examiner

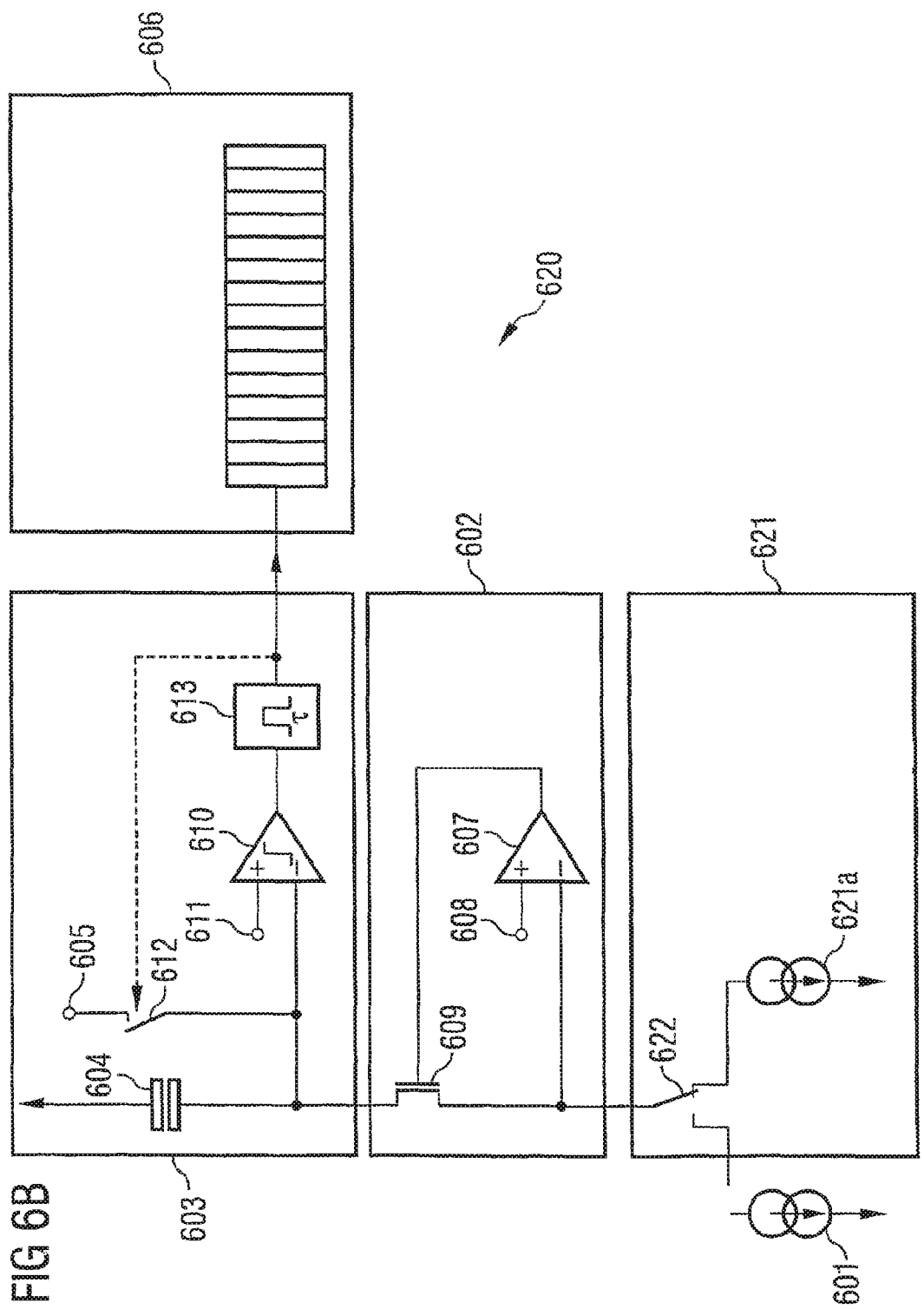

TESTING AND CALIBRATION OF A CIRCUIT ARRANGEMENT

BACKGROUND OF THE INVENTION

Field of the Invention

The present invention relates to the testing and/or the calibration of a circuit arrangement. In particular, the present invention relates to a circuit arrangement and to a method for testing and/or calibrating a circuit arrangement.

Description of Related Art

A circuit arrangement of the type on which the present invention is based is known by way of example from European Patent Application EP 1 636 599 B1 and corresponding U.S. Patent Application Publication US 2007/0080060 A1.

The circuit arrangement of the type in question is in particular designed for potential stabilisation on a biosensor and for digitisation of a measurement current.

The circuit arrangement of the type in question comprises a sensor electrode. Furthermore, the circuit arrangement comprises a first circuit unit that is electrically coupled to the sensor electrode. In addition, the circuit arrangement comprises a second circuit unit that comprises a first capacitor.

The following publications are cited in this document as being of relevance:
[1] Hintsche, R., Paeschke, M., Uhlig, A., Seitz, R. (1997) "Microbiosensors using Electrodes made in Si-technology", Frontiers in Biosensorics, Fundamental Aspects, Scheller, F. W., Schubert, F., Fedrowitz, J. (eds.), Birkhauser Verlag Basel, Switzerland, pages 267-283
[2] van Gerwen, P. et al. (1997) "Nanoscaled Interdigitated Electrode Arrays for Biochemical Sensors", IEEE, International Conference on Solid-State Sensors and Actuators, Jun. 16-19, 1997, Chicago, USA, pages 907-910
[3] Paeschke, M., Dietrich, F., Uhlig, A., Hintsche, R. (1996) "Voltammetric Multichannel Measurements Using Silicon Fabricated Microelectrode Arrays", Electroanalysis, vol. 8, no. 10, pages 891-898
[4] Uster, M., Loeliger, T., Guggenbühl, W., Jäckel, H. (1999) "Integrating ADC Using a Single Transistor as Integrator and Amplifier for Very Low (1 fA Minimum) Input Currents", Advanced A/D and D/A Conversion Techniques and Their Applications, Conference at the University of Strathclyde (UK) Jul. 27-28, 1999, Conference Publication no. 466, pages 86-89, IET
[5] Breten, M., Lehmann, T., Braun, E. (2000) "Integrating data converter for picoampere currents from electrochemical transducers", ISCAS 2000, IEEE International Symposium on Circuits and Systems, May 28-31, 2000, Geneva, Switzerland, pages 709-712
[6] U.S. Pat. No. 3,711,779
[7] U.S. Pat. No. 4,199,728
[8] Thewes, R. et al. (2002) "Sensor arrays for fully-electronic DNA detection on CMOS", Solid-State Circuits Conference, IEEE International Feb. 3-7, 2002, San Francisco, USA, pages 350-473

SUMMARY OF THE INVENTION

The first circuit unit is configured so as to keep the electrical potential of the sensor electrode in a specifiable or pre-definable first reference range around a specifiable or pre-definable target electrical potential. This is achieved by means of the first capacitor and the sensor electrode being coupled such that matching of the electrical potential is made possible or enabled.

Furthermore, the second circuit unit is configured such that, if the electrical potential of the first capacitor is outside a second reference range, said unit detects this event and brings the first capacitor to a first electrical reference potential.

A connectible reference current source is provided at the sensor electrode. Said current source provides a known reference current that is intended for ensuring a reference current when the reference current source is connected to the sensor electrode, such that the reference current is injected into the sensor electrode or into an electrical connection line or wiring between the sensor electrode and the first circuit unit.

In other words, the reference current source therefore is or can be electrically coupled to the sensor electrode or to the connection line or wiring connecting said electrode to the first circuit unit such that, when the circuit arrangement is functioning correctly, the reference current source causes a current flow into or out of the first circuit unit, and in particular preferably through the sensor electrode and/or the connection line or wiring connecting said electrode to the first circuit unit.

According to a first aspect of the present invention, in a testing and/or calibration mode of the circuit arrangement, the reference current source is adjusted so as to inject into the sensor electrode and/or the connection line or wiring no current as well as a first reference current having a first current strength and at least one second reference current having a second current strength that is different from the first current strength.

In other words, the reference current source can be set to or adjusted between different current strengths. Preferably, the different current strengths are set or adjusted, preferably successively, in order to test and/or calibrate the circuit arrangement.

In particular, it has surprisingly been found that an adjustable reference current source, by means of which different currents, i.e., currents having different current strengths, are injected makes it possible to make more accurate statements regarding the functioning of the circuit arrangement. It is thus possible to assign measurement results, generated by the circuit arrangement, to the respective current strengths, and in this way, to create and/or analyse a relationship between the results generated by the circuit arrangement and the respective current strengths.

In principle, it is desirable for there to be an at least substantially linear relationship between the sensor current, which can be generated by electrochemical processes during a measurement and can flow into the first circuit unit, and the result created by the circuit arrangement. In any case, it is desirable to know the relationship between the sensor current and the measurement result, in order to be able to reliably conclude the sensor current from the measurement result. The adjustability of the reference current source makes it possible to determine the relationship between measurement results generated by the circuit arrangement and the sensor current, for the relevant circuit arrangements. For this purpose, in the case of correct functioning, the known reference current flows into the first circuit unit as the sensor current or in a manner forming the sensor current. For the test and/or the calibration, the sensor current is therefore preferably formed or replaced by the reference current.

In practice, circuit arrangements are produced in series and are subject to variation of the component properties. It is therefore possible, by means of the reference current source and/or the proposed adjustment thereof, to determine a linearity, i.e. the linear relationship between measurement results and sensor currents or a deviation therefrom, tor the relevant circuit arrangement. Alternatively, or in addition, the measurement results created by the circuit arrangement can be checked and/or corrected on the basis of the relationships determined. Using a reference current source that is adjusted or adjustable in the proposed manner thus allows for both functional testing and calibration of the circuit arrangement, and this improves the reliability of the functioning and the measurement results of the circuit arrangement.

Another aspect of the present invention, which can also be implemented independently, relates to a method in which a measurement result is generated depending on the current injected into the sensor electrode, said measurement result being analysed or checked for a short circuit between the sensor electrode of the tested circuit arrangement on the one hand and another sensor electrode or a reference electrode on the other hand. Alternatively, or in addition, a connection problem between the sensor electrode and the first circuit unit is determined or can be determined by means of the measurement result.

The measurement result is in particular a frequency or corresponds thereto. The measurement result can be generated by the events or the counting thereof, or correspond thereto, which events or counts are detected or detectable on account of the injected current. The measurement result is particularly preferably a frequency of detected events, the frequency depending on the reference current or the sensor current or the current strength thereof.

In other words, a check is made in this aspect of the present invention as to whether the sensor electrode has been unintentionally short-circuited to another electrode, and/or whether the sensor electrode is properly electrically coupled to the first circuit unit, such that a proper measurement can consequently be carried out.

If there is a short circuit of the sensor electrode to another electrode, for example of an adjacent circuit arrangement, at least some of the reference current injected by the reference current source drains into or through the other sensor electrode, for example into the adjacent circuit arrangement. This can be seen in the measurement result, such that a measurement result of this kind, for example having a frequency that is lower than expected or anticipated, allows a short circuit of this kind to be detected or a short circuit is detected by means of a result of this kind. One or more target values may be provided, predefined or specified, with which values the measurement results are compared. In the case of deviations, a fault, in particular a short circuit or a break, can be detected.

Preferably, for the purpose of short-circuit detection, a corresponding test of the adjacent circuit arrangement is in addition carried out. If measurement results differ from the expected value in these circuits, this may lead to drainage of current into said circuits, which is determined or determinable on the basis of the measurement results of said circuits. If corresponding results or measured values are achieved here, fault handling can be triggered, for example deactivation of the circuit arrangements affected.

When the reference current source of the circuit arrangement is activated, a measurement result of one or more adjacent circuit arrangements is preferably also determined. This is carried out such that the reference current injected by the reference current source, provided said current drains into the adjacent circuit arrangements at least in part, is detected or can be detected by said circuit arrangements.

The corresponding test methods can also be combined with one another, such that, on the one hand, a measurement result is checked, for example by means of a target value comparison, and, on the other hand, the measurement results of one or more adjacent circuit arrangements are checked for effects of the current injected by the reference current source on the measurement results of said arrangements. This results in twice the certainty when detecting short circuits.

In the case of a connection problem between the sensor electrode and the first circuit unit, it should be assumed that the measurement results do not change, or do not change in the expected extent, subject to the reference current. If the dependency of the measurement results on the reference current is non-existent or is weaker than expected, a connection problem can be detected or detectable by means of a target value comparison or the like.

In another aspect of the present invention, which can also be implemented independently, the sensor electrode preferably forms what is known as an interdigital structure. interdigital structure is a finger-like arrangement of electrical strip conductors, referred to as fingers, said strip conductors preferably being electrically interconnected and/or being arranged so as to alternate, but so as to be galvanically separated from fingers of another electrode, in particular sensor electrode.

In this case, the reference current source is preferably used to inject the reference current both into a first and into another, second portion of the sensor electrode. In this case, the first portion is preferably part of the interdigital structure, while the second portion is preferably provided in the region of the connection between the interdigital structure and the first circuit unit.

This advantageously makes it possible to check or verify the electrical coupling between the sensor electrode and the first circuit unit, and in the process to differentiate between a contact problem in the region of the interdigital structure and a contact problem in the region of the connection of the interdigital structure.

It is thus possible to generate a first measurement result by means of the circuit arrangement when the reference current provided by the reference current source is injected into the interdigital structure or the first portion. Furthermore, a second measurement result can be determined when the reference current source injects the reference current into the second portion or into the connection between the interdigital structure and the first circuit unit. Said measurement results can be analysed individually and/or related or compared with one another in order to identify a contact problem and, in particular, to locate a region in which the contact problem is caused.

The above-mentioned aspects of the present invention, which can also be implemented independently of one another, can be implemented individually but can also be advantageously combined with one another.

It is thus possible, for example, by means of the reference current source, to inject the first reference current and at another time/subsequently to inject the second reference current, and in each case, to carry out a short circuit check, in particular by means of a target value comparison.

For example, in the case of similarly or proportionally changed measurement results that are determined by injecting the different first and second reference currents, it is possible to conclude the existence of a short circuit to the sensor electrode of an adjacent circuit arrangement.

The adjacent circuit arrangements are preferably in principle constructed at least substantially identically, such that, in the case of a short circuit of the sensor electrodes of two adjacent circuit arrangements, an injected current is divided at least substantially uniformly between the first circuit units of said circuit arrangements, which should have a corresponding effect in the measurement results both in the first and in the second current strength. If this is not the case, a short circuit is not clearly identified or is not complete or is low-ohmic or is not formed to an adjacent circuit arrangement, and this is determined or determinable on account of the measurement results which correspond to different current strengths of the reference current source.

Other combinations of the above-mentioned, mutually independent aspects of the present invention are advantageously possible in a corresponding manner.

Another aspect of the present invention, which can also be implemented independently, relates to a circuit arrangement of the type in question that is designed such that, in a testing and/or calibration mode, the reference current source can be adjusted or set so as to inject into the sensor electrode and/or the connection line or wiring no current, a first current having a first current strength, and at least one second current having a second current strength that is different from the first current strength.

In measuring mode of the circuit arrangement, the reference current source is preferably deactivated and/or decoupled from the sensor electrode.

Alternatively or in addition, the circuit arrangement is designed to determine electrical energy transmitted from the sensor electrode to the first circuit unit, both when the reference current source is deactivated and when said source is connected, as measurement results, such that a short circuit of the sensor electrode to another sensor electrode or a counter-electrode, and/or a connection problem between the sensor electrode and the first circuit unit can be determined by means of the measurement results.

Alternatively, or in addition, the sensor electrode preferably forms an interdigital structure and the reference current source is selectively connectable to a first portion and to another, second portion of the sensor electrode, such that the sensor current is injected into the first or second portion. Preferably, the first portion forms part of the interdigital structure and/or the second portion is provided in the region of the connection between the interdigital structure and the first circuit unit.

A reference current within the meaning of the present invention is preferably a known and/or predefined current. In particular, the current is a direct current or an at least substantially constant current. This does not exclude the possibility of the reference current being adjustable and being able to change at the adjustment times. However, between the adjustment processes or in a time period in which it is not adjusted, the reference current is at least substantially constant. In particular, the reference current is characterized by the fact that it can be injected into the sensor electrode. For this purpose, the reference current source is preferably electrically coupled to the sensor electrode, in particular galvanically attached or connected thereto. In this manner, the reference current source can generate a current that is impressed into the structure of the sensor electrode.

A sensor current within the meaning of the present invention is preferably a current that flows into the input of the first circuit unit, proceeding from the sensor electrode. In the testing and/or calibration mode, it is preferable for the sensor current to correspond to the reference current at least when the sensor electrode is properly manufactured and is fully functional. Some deviation may occur when the sensor electrode is not properly manufactured or is not operating properly. Detecting this is a subject of the present invention.

In the initial state, in which no sample is in contact with the sensor electrode, the sensor electrode is preferably an electrically conductive structure that is connected exclusively to the first circuit unit and can optionally be additionally connected to the reference current source. If the reference current source is electrically decoupled from the sensor electrode, the sensor electrode therefore has no direct electrical contact to other conductive structures and thus forms an open node for direct currents and/or DC voltages. This does not, in practice, exclude the existence of stray currents or leakage currents or creeping currents. Furthermore, it is not excluded that high-frequency signals may couple into the sensor electrode.

A strip conductor within the meaning of the present invention is preferably a galvanically conductive or metallic, preferably elongate, element that is designed or suitable for establishing electrical (galvanic) contact to the surroundings, in particular to a sample located in the surroundings. The sensor electrode therefore preferably has a conductive surface that may be formed by the strip conductors. The strip conductors may comprise gold at least on the surface or may be made of gold or coated with gold. This is also advantageous in connection with the immobilization of capture molecules, as will be described in more detail with reference to the embodiments. However, other solutions are possible here, too.

A current source within the meaning of the present invention is preferably an electrical circuit that provides an at least substantially constant and/or specified, predefined, given or known current. This can be achieved by means of a current source circuit controlling a voltage such that the load of the current source results in an at least substantially invariable current. The reference current source within the meaning of the present invention is preferably a real current source, in particular implemented by a circuit of this kind. The reference current source may have a finite internal resistance and/or the property of generating at most an operating or battery voltage of the circuit arrangement in the event of a high load resistance. Current sources may be created by means of current mirrors, field-effect transistors in the saturation region, or in other manners that are in principle known to a person skilled in the art. However, there are also other solutions here.

Other aspects and advantages of the present invention will become apparent from the following description of preferred embodiments with reference to the accompanying drawings.

BRIEF DESCRIPTION OF THE DRAWINGS

FIG. 6B is a schematic view of a circuit arrangement according to a third embodiment of the invention;

DETAILED DESCRIPTION OF THE INVENTION

In the following, a first preferred embodiment of the circuit arrangement according to the invention is described with reference to FIG. 1.

Figure 1:
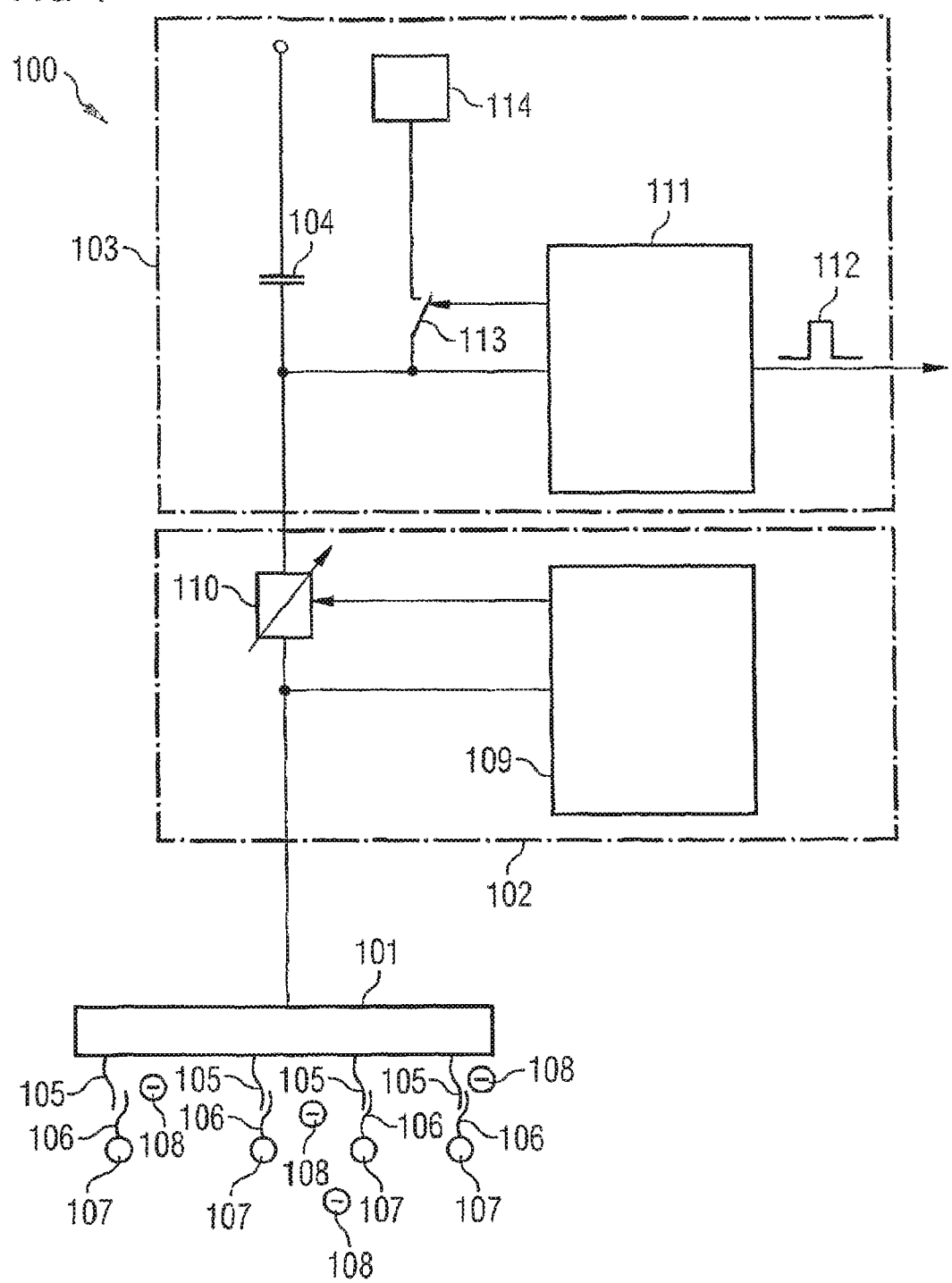
FIG. 1 is a schematic view of a circuit arrangement according to a first embodiment of the invention.

The circuit arrangement 100 shown in FIG. 1 comprises a sensor electrode 101, a first circuit unit 102 that is electrically coupled to the sensor electrode 101, and a second circuit unit 103 that comprises a first capacitor 104.

The first circuit unit 102, which is preferably a potentiostat, is preferably configured so as to keep the electrical potential of the sensor electrode 101 in a specifiable first reference range around a specifiable target electrical potential by means of the first capacitor 104 and the sensor electrode 101 being coupled such that matching of the electrical potential (by means of a current flow for feedback control) is possible.

Furthermore, the second circuit unit 103 is preferably configured such that, if the electrical potential of the first capacitor 104 is outside a second reference range, the unit 103 detects this event and brings the first capacitor 104 to a first electrical reference potential.

As is furthermore shown in FIG. 1, capture molecules 105 are immobilized on the surface of the sensor electrode 101; this may take place before or after a calibration and/or testing of the circuit arrangement.

The capture molecules 105 in FIG. 1 have hybridized or are designed to hybridize with molecules 106 to be detected, each of the molecules 106 to be detected preferably comprising an enzyme label 107.

Figure 2A:
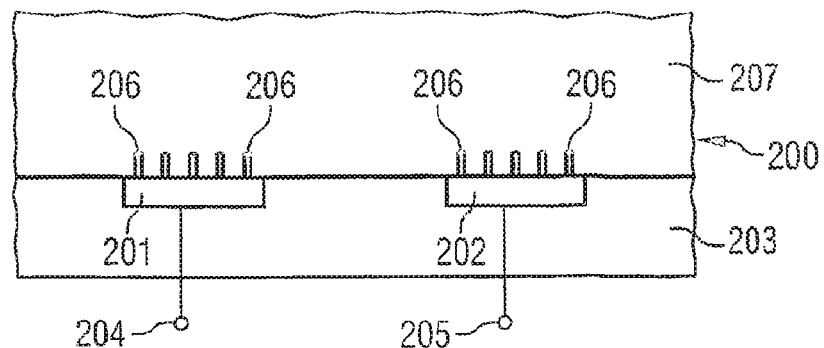
FIG. 2A is a cross section of a sensor according to the prior art in a first operating state.
Figure 2B:
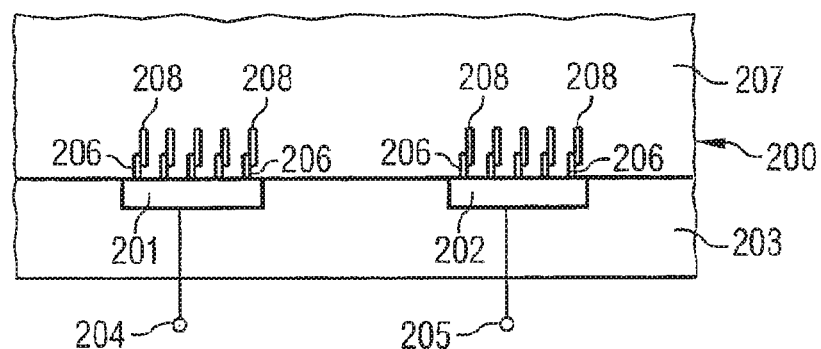
FIG. 2B is a cross section of the sensor according to the prior art in a second operating state.

FIG. 2A and FIG. 2B show a biosensor chip as is described in citation [1] of the list of citations at the end of this Description of Related Art, and on which the present invention is preferably based.

Preferably, the sensor 200 comprises two electrodes 201, 202, in particular made of gold, which are embedded in an insulator layer 203 made of electrically insulating material.

Electrode connections 204, 205 are preferably connected to the electrodes 201, 202, by means of which connections the electrical potential can be applied to the electrodes 201, 202.

The electrodes 201, 202 are preferably designed as planar electrodes.

For example, DNA probe molecules 206 (also referred to as capture molecules) are immobilized on each electrode 201, 202 (cf. FIG. 2A). The immobilization preferably takes place in accordance with the principle of gold-sulphur coupling. The analyte to be tested, for example a solution 207, in particular an electrolyte 207, is applied on the electrodes 201, 202.

If the solution/electrolyte 207 contains DNA strands 208 having a base sequence that is complementary to the sequence of the DNA probe molecule 206, i.e. that sterically match the capture molecules in accordance with the key-lock principle, said DNA strands 208 then hybridize with the DNA probe molecules 206 (cf. FIG. 2B).

Hybridization of a DNA probe molecule 206 and a DNA strand 208 takes place only if the sequences of the relevant DNA probe molecule 206 and the corresponding DNA strand 208 are mutually complementary. If this is not the case, hybridization does not occur. A DNA probe molecule of a specified sequence is thus only capable of binding, i.e. hybridizing with, a specific DNA strand, namely the DNA strand having the respectively complementary sequence, resulting in a high degree of selectivity of the sensor 200.

If hybridization takes place, the value of the impedance between the electrodes 201 and 202 changes, as can be seen in FIG. 2B. This changed impedance is preferably detected by means of applying a suitable electrical voltage to the electrode connections 204, 205 and by means of detecting the current resulting therefrom as the sensor current S.

In the case of hybridization, the impedance between the electrodes 201, 202 changes. This is due to the fact that both the DNA probe molecules 206 and the DNA strands 208 that possibly hybridize with the DNA probe molecules 206 are electrically less conductive than the solution/electrolyte 207 and thus, preferably, electrically shield the relevant electrodes 201, 202 in part.

Figure 3A:
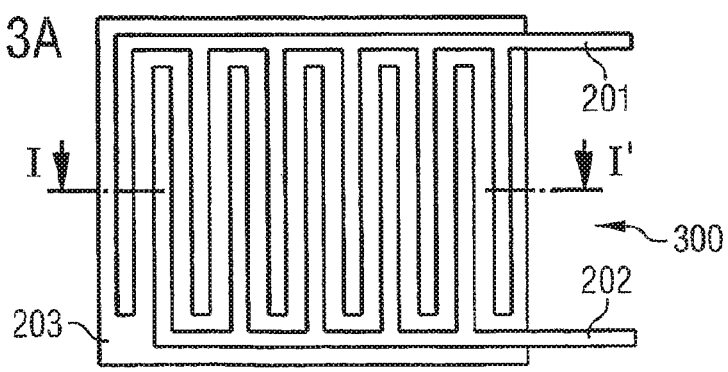
FIG. 3A is a plan view of interdigital electrodes according to the prior art.
Figure 3B:
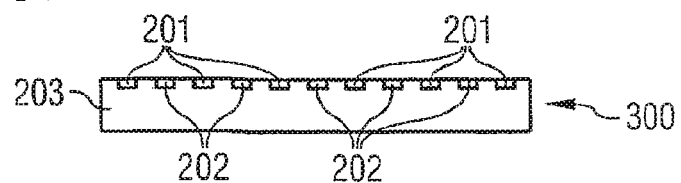
FIG. 3B is a cross section along the cutting line I-I' of the interdigital electrodes according to the prior art shown in FIG. 3A.

In order to improve the measuring accuracy, it is known from citation [2] of the citation list to use a plurality of electrode pairs 201, 202 and to arrange said electrode pairs so as to be parallel to each other, said pairs preferably being arranged in a mutually interlocked or intermeshed manner so as to result in what is known as an interdigital electrode 300, the plan view of which is shown in FIG. 3A and the cross-sectional view of which, along the cutting line I-I' from FIG. 3A, is shown in FIG. 3B.

Furthermore, principles of a reduction-oxidation recycling process for detecting macromolecular biomolecules are known from citations [1] and [3] of the citation list, for example, and preferably also form the basis of the present invention or are compatible or can be combined therewith. The reduction-oxidation recycling process, also referred to in the following as the redox cycling process, will be explained in greater detail in the following, with reference to FIG. 4A, FIG. 4B and FIG. 4C.

Figure 4A:
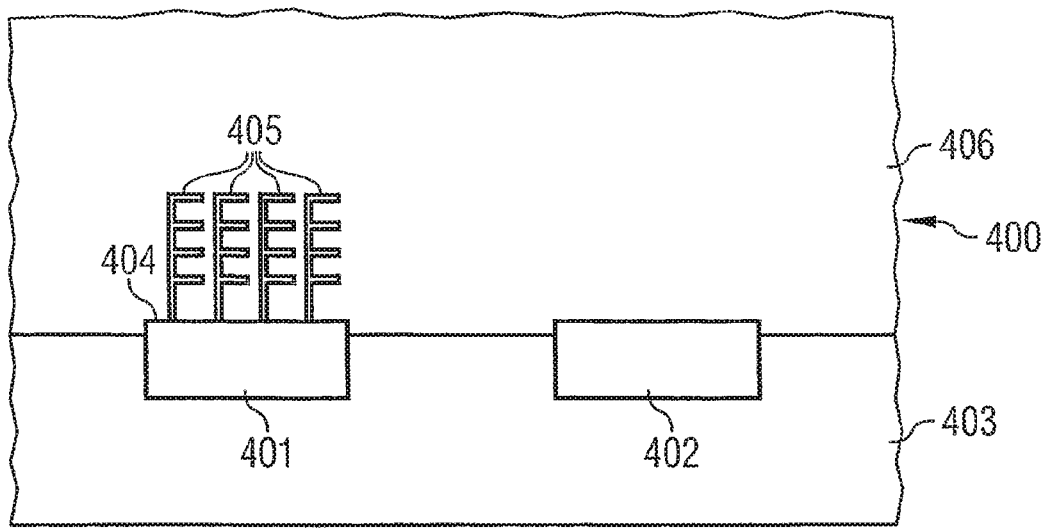
FIG. 4A shows a biosensor, based on the redox cycling principle, in a first operating state according to the prior art.

FIG. 4A shows a biosensor 400 comprising a first electrode 401 and a second electrode 402 that are applied on or embedded in an insulator layer 403. A retaining region 404 is applied on or provided on the first electrode 401. The retaining region 404 is used for immobilizing DNA probe molecules 405 on the first electrode 401. A retaining region of this kind is preferably not provided on the second electrode 402.

If DNA strands 407 having a sequence that is complementary to the sequence of the immobilized DNA probe molecules 405 are to be detected by means of the biosensor 400, the sensor 400 is then brought into contact with a solution 406 to be tested, for example an electrolyte, in such a way that DNA strands 407 having the complementary sequence, which are possibly contained in the solution 406 to be tested, can hybridize with the sequence of the DNA probe molecules 405.

Figure 4B:
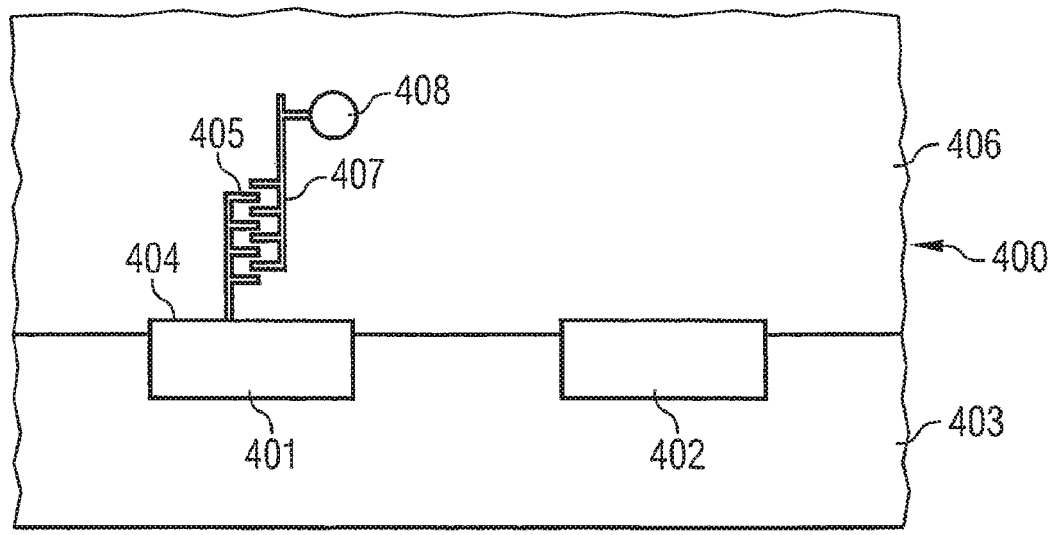
FIG. 4B shows a biosensor, based on the redox cycling principle, in a second operating state according to the prior art.

FIG. 4B shows the case in which the DNA strands 407 to be detected are contained in the solution 406 to be tested and are hybridized with the DNA probe molecules 405.

The DNA strands 407 in the solution 406 to be tested are preferably marked by an enzyme 408 or the like, by means of which it is possible to cleave molecules, described in the following, into partial molecules, at least one of which is redox-active. Usually a significantly larger number of DNA probe molecules 405 are provided than there are DNA strands 407 to be determined contained in the solution 406 to be tested.

After the DNA strands 407 possibly contained in the solution 406 to be tested are hybridized, together with the enzyme 408, with the immobilized DNA probe molecules 405, the biosensor 400 is preferably flushed, as a result of which the non-hybridized DNA strands are removed and the biosensor (chip) 400 is cleaned of the solution 406 to be tested. An electrically uncharged substance containing molecules 409 that can be cleaved by means of the enzyme 408 on the hybridized. DNA strands 407 into a first partial molecule 410 and into a second partial molecule is preferably added to the flushing solution used for flushing, or to a solution 412 fed in separately during a further phase. One of the two molecules is preferably redox-active.

Figure 4C:
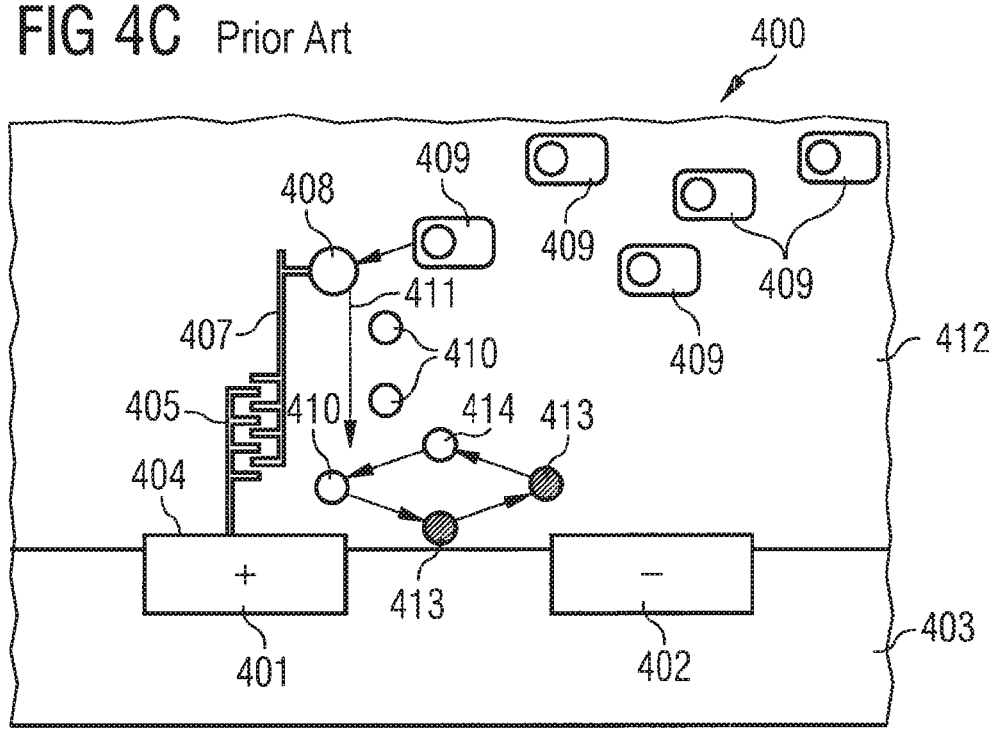
FIG. 4C shows a biosensor, based on the redox cycling principle, in a third operating state according to the prior art.

As shown in FIG. 4C, the for example negatively charged first partial molecules 410 are preferably drawn towards the positively charged first electrode 401, as indicated by the arrow 411 in FIG. 4C, Alternatively or in addition, it is also possible for the negatively charged first partial molecules 410 to reach the first electrode 401 by diffusion processes.

The negatively charged first partial molecules 410 are oxidized at the first electrode 401, which has a positive electrical potential, and are drawn, as oxidised partial molecules 413, to the negatively charged second electrode 402, where they are reduced again. The reduced partial molecules 414 in turn migrate to the positively charged first electrode 401. In this way, an electrical circulating current is generated which is proportional to the number of charge carriers respectively generated by means of the enzymes 406.

Figure 5:
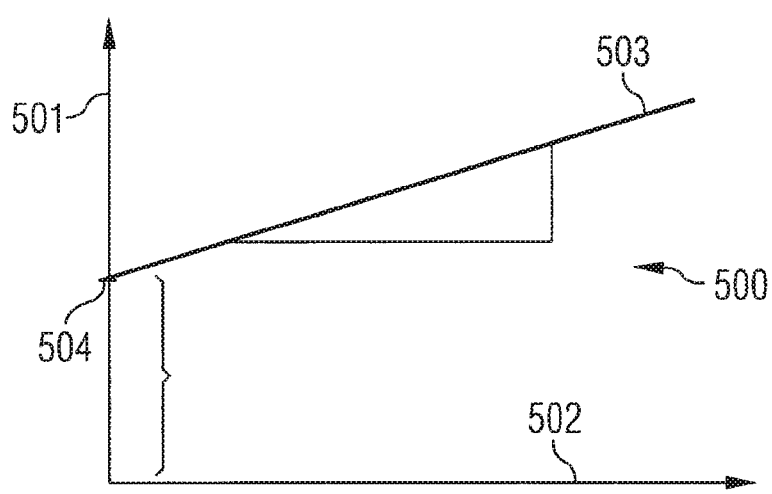
FIG. 5 is a functional curve of a sensor current within the context of a prior art redox cycling process.

The electrical parameter that is assessed in this method is the change in the electrical current $m=dI/dt$ as a function of time t, as is shown schematically in the diagram or graph 500 in FIG. 5.

FIG. 5 shows the function of the electrical current 501 depending on the time 502. The resulting curve profile 503 has an offset current $I_{offset}$ 504 that is independent of the temporal progression. The offset current $I_{Offset}$ 504 is generated on account of a result that is not ideal or imperfections of the biosensor 400. A significant cause of the offset current $I_{Offset}$ is the fact that the covering of the first electrode 401 with the DNA probe molecules 405 is not ideal, i.e., is not completely dense. In the event of a completely dense covering of the first electrode 401 with the DNA probe molecules 405, a substantially capacitive electrical coupling between the first electrode 401 and the electrically conductive solution 406 to be tested would result due to the so-called double-layer capacitance, which results from the immobilized DNA probe molecules 405. Incomplete covering, however, results in parasitic current paths between the first electrode 401 and the solution 406 to be tested, which current paths inter alia comprise ohmic portions.

In order to allow for the oxidation-reduction process, however, the covering of the first electrode 401 with the DNA probe molecules 405 should not be complete at all, in order that the electrically charged partial molecules, i.e. the negatively charged first partial molecules 410, can reach the first electrode 401 as a result of electrical force and/or diffusion processes. On the other hand, in order to achieve as great as possible a sensitivity of a biosensor of this kind and to simultaneously achieve as few parasitic effects as possible, the covering of the first electrode 401 with the DNA probe molecules 405 should be sufficiently dense. In order to achieve a high degree of reproducibility of the measured values determined by a biosensor 400 of this kind, both electrodes 401, 402 should always provide a sufficiently large surface for the oxidation-reduction process within the context of the redox cycling process.

Macromolecular biomolecules are to be understood for example as proteins or peptides or also DNA strands of respectively specified sequences. If proteins or peptides are to be detected as macromolecular biomolecules, the first molecules and the second molecules are preferably ligands, for example active substances having possible binding activity, which bind the proteins or peptides to be detected to the relevant electrode on which the corresponding ligands are arranged.

Enzyme agonists, pharmaceuticals, sugar or antibodies, or any other molecule that is capable of specifically binding proteins or peptides, may be used as ligands.

If DNA strands of a specified sequence that are intended to be detected by the biosensor are used as macromolecular biomolecules, it is then possible for DNA strands of a specified sequence to be hybridized with DNA probe molecules having the sequence complementary to the sequence of the DNA strands, on the first electrode, as molecules, by means of the biosensor.

A probe molecule (also referred to as a capture molecule) is to be understood as a ligand or a DNA probe molecule.

The value $m=dI/dt$ introduced above, which value corresponds to the slope of the straight line 503 in FIG. 5, depends on the length and the width of the electrodes used to detect the measurement current. The value m is therefore approximately proportional to the longitudinal extension of the electrodes used, for example, in the case of the first electrode 201 and the second electrode 202, proportional to the lengths thereof perpendicular to the drawing plane in FIG. 2A and FIG. 2B. If a plurality of electrodes are connected in parallel, for example in the known interdigital electrode arrangement (cf. FIG. 3A, FIG. 3B), then the change in the measurement current is proportional to the number of respective electrodes connected in parallel.

However, the value of the change in the measurement current can have a very significantly fluctuating value range on account of various influences, the current range that is detectable by a sensor being referred to as the dynamic range. A current range of five decades is frequently cited as a desirable dynamic range. The significant fluctuations may also be caused by biochemical constraints, in addition to the sensor geometry. It is thus possible that different types of macromolecular biomolecules to be detected may bring about very different value ranges for the resultant measurement signal, i.e. in particular the measurement current and the temporal change thereof, which in turn leads to an expansion of the overall dynamic range required, together with corresponding demands for a specified electrode configuration together with downstream uniform measurement electronics.

The demands for the large dynamic range of a circuit of this kind mean that the measurement electronics is expensive and complex in order to operate sufficiently accurately and reliably in the required dynamic range.

Furthermore, the offset current $I_{offset}$ is often much larger than the temporal change m in the measurement current over the entire measurement duration. In a scenario of this kind, a very small time-dependent change has to be measured within a large signal, at a high degree of accuracy. This places very high demands on the measuring instruments used, making the detection of the measurement current laborious, complicated and expensive. This fact also resists attempted miniaturisation of sensor arrangements.

In summary, the demands on the dynamic range, and therefore on the quality of a circuit for detecting sensor events are extremely high.

It is known in circuit design to take account of the non-idealities or imperfections in the components used (noise, parameter variations) in that an operating point in the circuit is selected for said components in which said non-idealities or imperfections play as negligible a role as possible.

However, if a circuit is to be operated over a large dynamic range, it becomes increasingly more difficult, more complex and therefore more expensive to maintain an optimal operating point over all the ranges.

Small signal currents, such as they arise at a sensor for example, can be raised, by means of amplifier circuits, to a level that allows for transfer of the signal current for example to an external device or allows for internal quantification.

For reasons of interference immunity and for the purpose of user friendliness, a digital interface between the sensor and the evaluating system is advantageous. The analogue measurement currents should therefore already be converted into digital signals close to the sensor, which may be achieved by means of an integrated analogue-to-digital converter (ADC). An integrated concept of this kind for digitising an analogue small current signal is described in [4] for example.

In order to achieve the required dynamic range, the ADC should have a correspondingly high resolution and a sufficiently high signal-to-noise ratio. Furthermore, integrating an analogue-to-digital converter of this kind in the immediate vicinity of a sensor electrode is a significant technological challenge, and the corresponding process implementation is complex and expensive. Furthermore, it is extremely difficult to achieve a sufficiently high signal-to-noise ratio in the sensor.

Citation [5] above discloses a current-mode analog-to-digital converter configured for a maximum input current range of 5 nA and a resolution of the order of 1 pA, Citation [6] discloses a device for determining and characterizing the slopes of time-varying signals.

Citation [7] above discloses an electronic circuit for tracking an electronic signal to determine whether the slope of the signal at a predetermined time is greater than or equal to a predetermined value.

Citation [8] above discloses a sensor having sensor and collector electrodes whose potentials are adjusted by control circuits.

The sensor electrode 101 shown in FIG. 1, comprising the capture molecules 105 immobilized thereon, functions in accordance with the principle of redox cycling (cf. FIG. 4A, FIG. 4B, FIG. 4C). FIG. 1 therefore shows electrically charged particles 108 that are generated by the enzyme label 107 in the liquid to be tested, and that generate an electrical sensor current that is coupled from the first sensor electrode 101 into the circuit arrangement 100.

The sensor current changes the electrical potential of the sensor electrode 101 in a characteristic manner. The electrical potential is preferably applied at the input of a first control unit 109 of the first circuit unit 102.

The first circuit unit 102, and in particular the first control unit 109, preferably ensure that the sensor electrode 101 remains at a specifiable, constant electrical potential by means of charge carriers being shifted between the first capacitor 104 and the sensor electrode 101 in the event of a sufficiently significant deviation of the sensor electrode potential from the target electrical potential. This is indicated schematically in FIG. 1 by means of the controllable ohmic resistor 110 that can be (feedback) controlled by the first control unit 109.

The circuit block shown is a preferably analogue control loop that controls the current flow between the capacitor 104 and the sensor electrode 101 such that the voltage at the sensor electrode 101 remains constant.

A continuous (feedback) control of the current flow is made possible by means of the controllable resistor 110. If the electrical potential of the sensor electrode 101 moves outside the first reference range owing to a sufficiently large number of sensor events on the surface thereof, then the first circuit unit 102 and in particular the first control unit 109 ensures that the current flow between the sensor electrode 101 and the first capacitor 104 increases or decreases, such that it is possible to match the electrical potential between the first capacitor 104 and the sensor electrode 101.

Preferably, the resistance value of the controllable resistor 110 is thus increased or decreased by means of the first control unit 109 of the first circuit unit 102, such that a current flow between the sensor electrode 101 and the first capacitor 104 is made possible. In this scenario, electrical charge can flow back and forth between the first capacitor 104 and the sensor electrode 101.

If the electrical potential of the first capacitor 104 moves outside a second reference range owing to this charge shifting, this event is then detected by the second circuit unit 103 and in particular by a second control unit 111 of the second circuit unit 103, which control unit preferably comprises a comparator. As shown in FIG. 1, this detection can consist in or comprise an electrical pulse 112 being generated at an output of the second control unit 111.

Furthermore, if the electrical potential of the first capacitor 104 moves outside the second reference range, the first capacitor 104 is brought to the first electrical reference potential by means of the second circuit unit 103, and in particular the second control unit 111 of the second circuit unit 103. This is indicated in FIG. 1 in that a further switch 113 is closed as a result of a signal triggered by the second control unit 111 of the second circuit unit 103, as a result of which the first capacitor 104 is electrically coupled to a voltage source 114, with the result that the first capacitor 104 is brought to the first electrical reference potential that is defined by means of the voltage source 114.

A basic concept of the circuit arrangement 100 can illustratively be seen in that a sensor current to be detected is converted into a frequency proportional to the current without prior analogue amplification or gain. By means of the circuit arrangement 100, the potential at the sensor electrode 101 is kept constant and the electrical charge (with positive or negative sign) required therefor is drawn from a capacitor 104 having the capacitance C. As a result of the drawing of charge $\Delta Q$ $$\Delta Q = \int I dt \quad (1)$$

due to a current flow I between the first capacitor 104 and the sensor electrode 101, integrated over time t, the voltage $\Delta U$ applied to the first capacitor 104 changes in accordance with the relationship $$\Delta Q = C \Delta U \quad (2)$$

The voltage applied to the first capacitor 104 is preferably monitored by means of a threshold circuit. If a specified or predefined value is exceeded or if the voltage falls below the value, the circuit then triggers a digital impulse or pulse 112 that closes a switch 113, as a result of which the electrical voltage at the capacitor 104 is reset to a specified or predefined value. This results in a pulse sequence from the threshold circuit, the frequency of which sequence is proportional to the signal current, also referred to as the sensor current.

As described above with reference to FIG. 1, in order to operate an electrochemical sensor, the circuit arrangement 100 substantially comprises two circuit units 102, 103. The first circuit unit 102 controls and/or monitors the electrical potential (i.e., the voltage with respect to a reference point) applied to the sensor electrode 101.

For example, an operational amplifier can be used to compare the electrical potential of the sensor electrode 101 to a reference potential, and to control the electrical current flow between the sensor electrode 101 and the first capacitor 104 such that the electrical potential of the sensor electrode 101 remains constant.

Preferably, the counter-current required for matching the sensor current is, as described, drawn from the first capacitor 104 of the second circuit unit 103. The voltage at the first capacitor 104 is monitored in the second circuit unit 103 by means of a threshold circuit, for example a comparator circuit. If a second reference range of the electrical potential applied to the first capacitor 104 is exceeded, undershot or not met, the second circuit unit 103 emits a reset pulse. This digital pulse, which is preferably of a fixed temporal length, resets the potential of the capacitor 104 (or the electrical voltage between the two capacitor plates) to a first electrical reference potential. The pulse should be of a constant length, since the counter-current is drawn from a voltage source 114 during this time. This dead time reduces the measured frequency and, provided that the dead time is not negligibly small, has to be taken into account when evaluating the data.

In a scenario in which the dead time is not negligibly small and/or is to be compensated, in order to minimise the measurement error due to the resetting of the circuit, it is possible for two (or more) capacitors to be provided which are operated alternately in the manner described. If one (the active) capacitor is charged by the sensor current, the other (passive) capacitor is reset, in this time interval, to the first electrical reference potential. If the potential at the active capacitor exceeds the specified or predefined value, the second circuit unit 103 preferably does not immediately trigger a reset pulse but instead initially switches between the two capacitors and only subsequently resets the now passive capacitor. This approach means that the sensor current is never drawn directly from a voltage source, but instead always from a capacitor which acts as a charge reservoir.

Referring again to FIG. 1, the reset process is preferably carried out by means of a switching transistor that discharges the first capacitor 104, during the reset phase, to a specifiable potential (for example fully discharges the capacitor). The first electrical reference potential is preferably a ground potential. The sensor current subsequently charges the first capacitor 104 again. The temporal dependency of the electrical voltage at the first capacitor 104 can be described by the following expression:

$$U(t) = 1/C \int_0^t I_{Sensor} dt' \quad (3)$$

As will be described later with reference to FIG. 5, the sensor current $I_{Sensor}$ discharged from the sensor electrode 101 has a constant offset portion $T_{Offset}$ and a signal current that (ideally) increases linearly with time:

$$I_{sensor} = I_{Offset} + mt \quad (4)$$

If equation (4) is inserted into equation (3) and the integral is calculated, the electrical voltage that builds up between a first time point $t_1$ and a second time point $t_2$ results in:

The time interval $\Delta t$ in which a specific voltage difference $\Delta U$ is built up is $$U(t) = 1/C(I_{offset}[t_2-t_1] + m/2[t_2^2-t_1^2]) \quad (5)$$

therefore;

$$\Delta t = t_2 - t_1 = (C\Delta U)/(I_{offset} + mt) \quad (6)$$

In this case, t is the average time of the interval considered, i.e., $$t = (t_1+t_2)/2 \quad (7)$$

The frequency f measured within a sufficiently short interval $\Delta t$, ignoring a dead time t when resetting the capacitor, ($t_{dead} \ll \Delta t$) accordingly results in:

$$f = \Delta t^{-1} = I_{offset}/(C\Delta U) + mt/(C\Delta U) \quad (8)$$

This frequency f can be directly conducted away from the circuit arrangement 100 as a digital signal (for example from a chip, if the circuit arrangement is integrated into a semiconductor substrate) and processed further or evaluated. Equation (8) shows that the frequency f has a constant portion that is due to the offset current $I_{offset}$ of the sensor electrode 101. The second term in (8) represents the frequency portion that increases linearly with time (the assumption of an exactly linearly increasing current signal is of course idealised), which portion is due to sensor events in accordance with the redox cycling principle and contains the actual measurement variable m.

The variable m that is to be determined, which corresponds to the temporal change of the measurement current, is obtained for example by carrying out two period or frequency measurements at a specified temporal spacing $\Delta t_{Mess} = t_B - t_A$. If $t_A$ or $t_B$ are inserted into equation (8), respectively, and the resultant frequencies $f_A$ and $f_B$ are subtracted from one another, the following is obtained as the frequency difference $\Delta f$:

$$\Delta f = f_B - f_A = m\Delta t_{Mess}/(C\Delta U) \quad (9)$$

Consequently, the variable m is:

Accordingly, the variable in can be directly determined from two measurements of the output frequency of the sensor, in particular the variable in being the slope of the current- $$m = \Delta f C\Delta U/\Delta t_{Mess} \quad (10)$$

time curve profile 503 in FIG. 5.

As an alternative to the frequency or period duration measurement described, it is possible to provide the pulses 112 of the second circuit unit 103, in particular of the second control unit 111, to the input of a counting element 606 (as shown in the exemplary embodiments according to FIGS. 6A and 6B) that adds the number or the temporal sequence of the pulses 112 and preferably converts this into a binary word that codes the number of elapsed time intervals $\Delta t$.

A counting element 606 of this kind can count the reset pulses 112 of the first capacitor 104 over a specified time, output the counter reading digitally following an external pulse, and subsequently reset the counting element 606.

In a good approximation, the (counter) reading n of the counting element 606 of the circuit arrangement after the expiry of the time period $t_{Count}=t_{c2}-t_{c1}$ defined by the time points $t_{c1}$ and $t_{c2}$ is:

$$n = \int_{t_{c1}}^{t_{c2}} f dt = I_{offset}(t_{c2}-t_{c1})/(C\Delta U) + m(t_{c2}^2 - t_{c1}^2)/(2C\Delta U) \quad (11)$$

In accordance with what has been set out above relating to the determination of in from frequency measurements, at least two measurements of the (counter) reading n are necessary, from which measurements both $I_{Offset}$ and the variable in can be determined by means of equation (11).

An advantage of integrating a counting element 606 into the circuit arrangement 100 of the invention is the resultant automatic time averaging of the measurement result. Since fluctuations in the instantaneous value of the measured variable (for example owing to noise effects, etc.) are possible in the case of the expected small sensor currents, in particular when detecting biomolecules, averaging is particularly advantageous.

According to a preferred embodiment of the circuit arrangement 100, the second circuit unit 103 comprises at least one second capacitor, the circuit arrangement 100 being configured such that either one of the at least one second capacitors, or the first capacitor, or at least two of the capacitors, is/are connected to the circuit arrangement 100 simultaneously.

In particular, in order to enlarge the dynamic range and to improve the measuring accuracy, a switchable storage capacitance is provided. If the sensor electrode 101 delivers an increased electrical sensor current, which would result in an increased output frequency, a further capacitor may be connected in parallel with the first capacitor 104 for example. This reduces the output frequency and thus possible measurement inaccuracies owing to the dead time when resetting the first capacitor 104. In addition to the switching of the measuring range that is achieved in this way, the interval $\Delta U$, within which the capacitor voltage oscillates, can also be changed. This allows the measuring range to be tuned continuously.

In the following, a circuit arrangement 600 according to a second preferred embodiment, on which arrangement the present invention is preferably based, is described with reference to FIG. 6A. The aspects set out in connection with the preceding figures may be correspondingly applicable or implementable here. In particular, similar or identical components, such as sensor electrode 101, 601, first circuit unit 102, 602 second circuit unit 103, 603, first capacitor 104, 604, and the like, may have the same or corresponding features and advantages.

The circuit arrangement 600 comprises a sensor electrode 601, a first circuit unit 602 that is electrically coupled to the sensor electrode 601, and a second circuit unit 603 that comprises a first capacitor 604.

The first circuit unit 602 is preferably designed so as to keep the electrical potential of the sensor electrode 601 in a specifiable first reference range around a specifiable target electrical potential by means of the first capacitor 604 and the sensor electrode 601 being coupled such that matching of the electrical potential is possible.

Furthermore, the second circuit unit 603 is preferably designed such that, if the electrical potential of the first capacitor 604 is outside a second reference range, the unit detects this event and brings the first capacitor 604 to a first electrical reference potential of the second circuit unit 603, which potential is provided by a first voltage source 605.

Moreover, the circuit arrangement 600 preferably comprises a counting element 606 that is electrically coupled to the second circuit unit 603 and is configured to count the number and the temporal sequence of the events.

Moreover, the first circuit unit 602 preferably comprises a first comparator element 607 having two inputs and one output, the first input being coupled to the sensor electrode 601 such that the first input is at the electrical potential of the sensor electrode 601.

The second input is preferably brought to a third electrical reference potential which defines the target electrical potential (or the first electrical reference range). The third electrical reference potential, which is applied to the second input of the first comparator element 607, is provided by a second voltage source 608. Furthermore, the first comparator element 607 is designed such that an electrical signal is generated at the output thereof, which signal is such that the electrical potential of the sensor electrode 601 is kept in the specifiable first reference range around the specifiable target electrical potential.

Figure 6A:
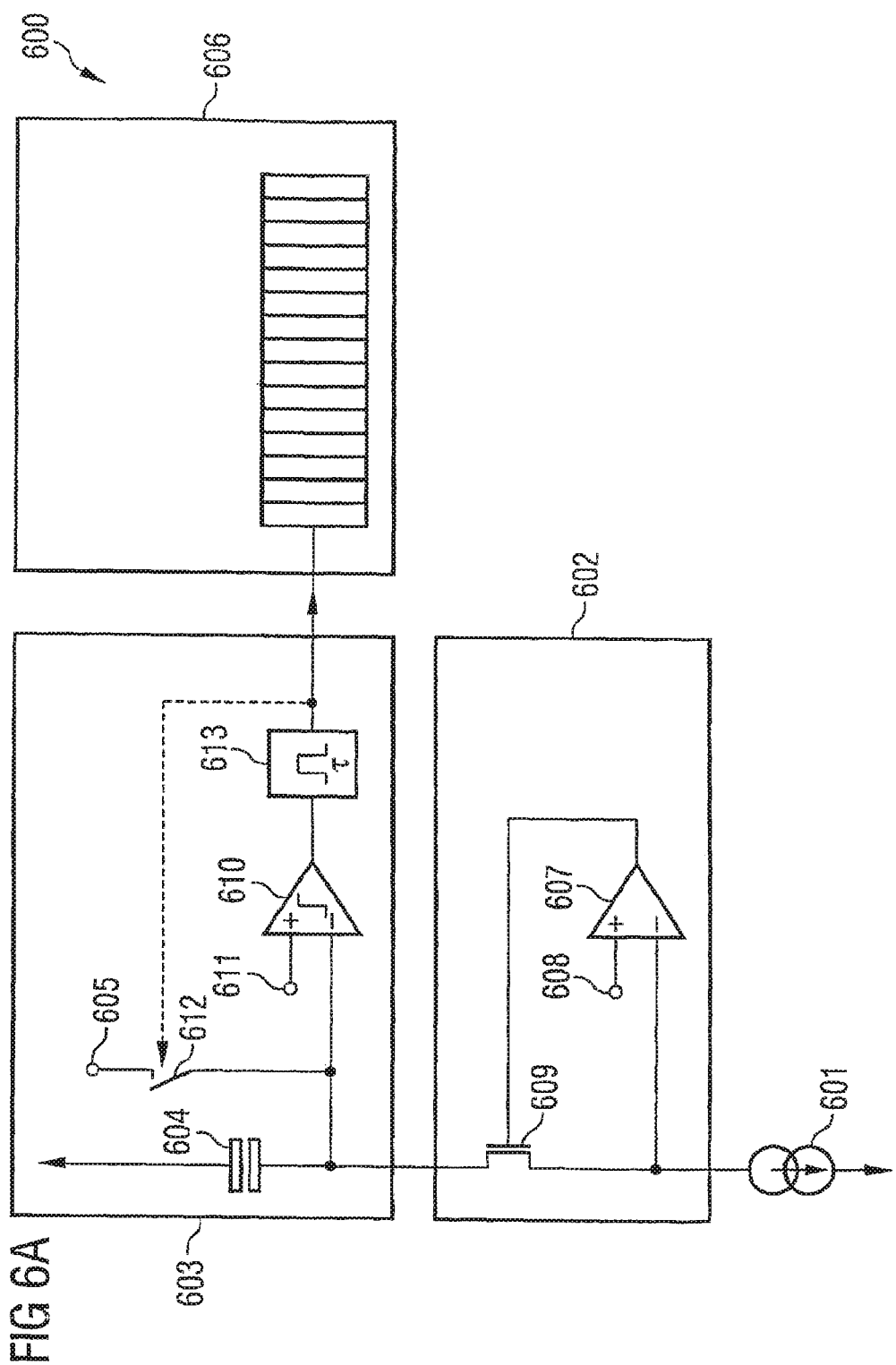
FIG. 6A is a schematic view of a circuit arrangement according to a second embodiment of the invention.

As is further shown by way of example in FIG. 6A, the first circuit unit 602 comprises a transistor 609, the gate region of which is coupled to the output of the first comparator element 607, the first source/drain region of which is coupled to the sensor electrode 601, and the second source/drain region of which is coupled to the first capacitor 604.

Preferably, the (field-effect) transistor 609 is a variable ohmic resistor (controllable by the first comparator element 607), by means of which the sensor electrode 601 can be coupled to the first capacitor 604 of the second circuit unit 603 such that the electrical potential of the sensor electrode 601 is kept in the predefinable first reference range, around the pre-definable target electrical potential.

In other words, any intermediate value between complete coupling and complete decoupling of the sensor electrode 601 and the capacitor 604 can be set or adjusted by means of the transistor 609.

Furthermore, the second circuit unit 603 preferably comprises a second comparator element 610 having two inputs and one output, the first input being coupled to the first capacitor 604 such that the first input is at the electrical potential of the first capacitor 604, and the second input being at a fourth electrical reference potential provided by a third voltage source 611, which fourth electrical reference potential defines the second electrical reference range.

The second comparator element 610 is preferably configured such that an electrical signal is generated at the output thereof, which signal is such that, if the electrical potential of the first capacitor 604 exceeds the fourth electrical reference potential, the first capacitor 604 is brought to the first electrical reference potential. For this purpose, the second circuit unit 603 provides the switch 612 (that may be designed as a transistor for example) with an electrical signal that is such that the switch 612 is closed and electrical coupling is established between the first voltage source 605 and the first capacitor 604.

Furthermore, a pulse generator 613 is preferably connected to the output of the second comparator 610, which pulse generator detects the event of the electrical potential of the first capacitor 604 being outside the second reference range, and emits a digital pulse of a defined length $\tau$.

As FIG. 6A further shows, the pulse signal of the pulse generator 613 is preferably provided to the counting element 606 which counts the number of pulses and the temporal sequence thereof (i.e. the frequency at which the pulses arrive).

Preferably, the first comparator element 607 and the second comparator element 610 of the circuit arrangement 600 are, respectively, designed as an operational amplifier, but can also be implemented in another manner.

The schematic circuit diagram of the circuit arrangement 600 shown in FIG. 6A thus preferably comprises a potentiostat unit that is implemented by means of the first circuit unit 602 and/or by means of the first capacitor 604. The potentiostat unit keeps the electrical potential of the sensor electrode 601 at the target electrical potential within the first reference range that is defined by means of the third electrical reference potential.

The sensor current discharged from the sensor electrode 601 is drawn from the second circuit unit 603 which in addition functions as a current-to-frequency converter.

The first capacitor 604 delivers electrical charge to the sensor electrode 601 in order to hold the electrical potential thereof, the electrical voltage applied to the first capacitor 604 being monitored by means of the comparator circuit described.

If the electrical voltage of the first capacitor 604 falls below a threshold value, the comparator 610 or the pulse generator 613 then preferably triggers a pulse of the defined length l that changes the potential of the first capacitor 604 to the electrical potential of the first voltage source 605 by means of the switch 612. The pulse in addition functions as a count pulse for the optional counting element 606 that is coupled to the output of the second comparator element 610.

It should be emphasised that the circuit arrangement 600 shown in FIG. 6A is configured such that it provides electrical current to the sensor electrode 601; the sensor electrode 601 operates as a current sink in this case. If, in contrast, electrical currents generated at the sensor electrode 601 are intended to be consumed by the circuit arrangement 600, the arrangement can be constructed in a complementary manner.

In the following, a third preferred embodiment of the circuit arrangement according to the invention will be described with reference to FIG. 6B. The elements of the circuit arrangement 620 that correspond to the circuit arrangement 600 shown in FIG. 6A and described above are provided with the same reference signs. In the following, merely those components of the circuit arrangement 620 that differ from the circuit arrangement 600 shown in FIG. 6A are described in greater detail. Furthermore, the components and further features of the third embodiment may also be combined with other embodiments like the first embodiment shown in FIG. 1.

The circuit arrangement 620 comprises a calibration device 621, that can be coupled to the first circuit unit 602, for calibrating the circuit arrangement 620, which is configured such that a second electrical reference potential can be applied to the first circuit unit 602 by means of the calibration device 621, the first circuit unit 602 being coupled either to the calibration device 621 or to the sensor electrode 601.

It is particularly advantageous in the circuit arrangement 620 shown in FIG. 6B for the sensor electrode 601 to be optionally able to be decoupled from the first circuit unit 602 and to be able to be coupled instead to the calibration device 621, the main component of which is a reference current source 621A.

The circuit arrangement 620 can be calibrated by means of a calibration current generated by the calibration device 621. This is advantageous in particular when the exact value of the capacitance C of the first capacitor 604 is not known.

In addition to statistical fluctuations of the capacitance of the first capacitor 604 owing to variations in the process technology during the manufacturing method of the first capacitor 604, the parasitic capacitances of the circuit arrangement 620, which can be calculated only with significant effort or which cannot be calculated exactly at all, contribute substantially to the overall capacitance of the storage node and influence the resulting output frequency in which the current signal to be detected is coded significantly.

Offset voltages, in particular of the second comparator 610 in the current-to-frequency converter, and possible leakage currents or stay currents may also directly influence the output frequency to be detected.

As shown in FIG. 6B, the calibration device 621 preferably comprises a connectible reference current source 621A that provides a known sensor current or increases or reduces the current by a specified amount when the reference current source 621A is connected in parallel with the sensor electrode 601. The frequency change resulting from the connection is then used for calibrating the circuit arrangement 620. Calibration of this kind may be carried out in particular before an analyte is applied on or to the sensor electrode 601. In this case, the sensor electrode 601 does not provide any signal current originating from sensor events, and the output frequency is determined from the reference current of the reference current source 621A.

The selective connection of either the sensor electrode 601 or the calibration device 621 to the first circuit unit 602 is preferably achieved by means of a further switch 622. The switch 622 can preferably be switched in such a way that in the operating mode shown in FIG. 6B the calibration device 621 is connected to the second circuit unit 602, whereas in the operating mode shown in FIG. 6B the sensor electrode 601 is not connected to the first circuit unit 602. In a complementary scenario that corresponds to moving the further switch 622 shown in FIG. 6B, the sensor electrode 601 is connected to the first circuit unit 602, whereas the calibration device 621 is not connected to the first circuit unit 602.

With regard to the possible structure and the preferred functioning of components of the circuit arrangement 100, 600, reference is additionally made to the publication of European patent 1 636 599 B1, and in this case to the description of the figures for FIG. 7 to 16 on pages 15 to 23, the content of which is hereby incorporated in its entirety into this application.

Figure 7:
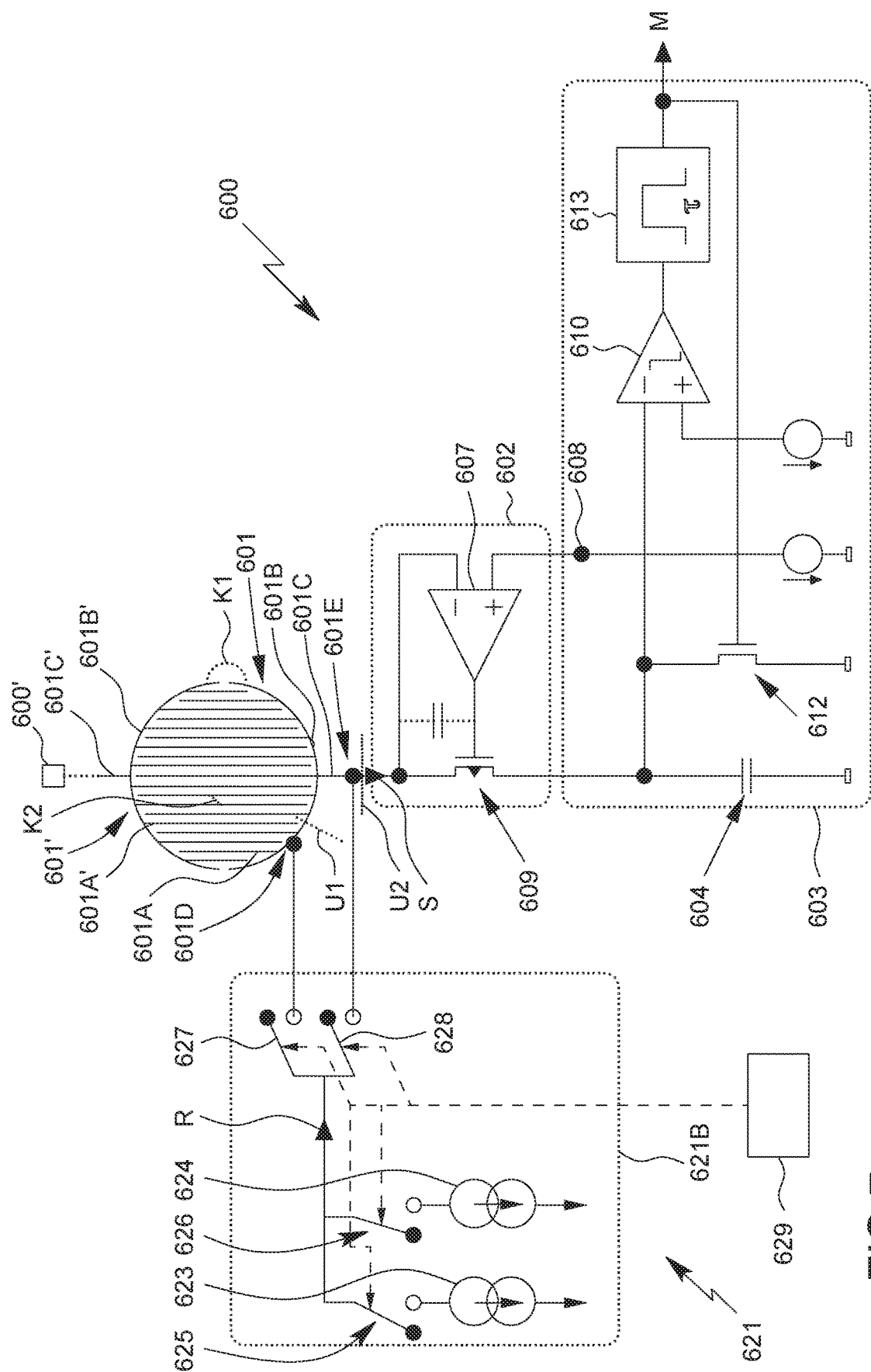
FIG. 7 is a schematic view of a circuit arrangement according to a further embodiment of the invention.

FIG. 7 schematically shows an embodiment of the present invention. The same reference signs as those in the embodiments according to FIG. 6A to 6B are used, it being possible for a corresponding structure, corresponding properties and corresponding advantages to be achieved, even if repeated description thereof is omitted. In this respect, reference is made to the above explanations regarding FIGS. 6A and 6B, and in addition also to the explanations regarding FIG. 1 to 5 with respect to further functions, features and properties of the circuit arrangement 100 described therein and/or of the structure and the functioning of the sensor electrode 101, which are in principle also applicable to or implementable on the corresponding components of the embodiment in FIGS. 6A and 6B and the embodiment explained in the following. Therefore, in the following only substantial differences and developments are explained in detail.

FIG. 7 shows a proposed circuit arrangement 600. The circuit arrangement 600 comprises a sensor electrode 601.

In the embodiment according to FIG. 7, the sensor electrode 601 is implemented as what is known as an interdigital electrode 601. In this case, the sensor electrode 601 comprises finger-like strip conductors 601A. The finger-like strip conductors 601A may be electrically or galvanically interconnected or coupled with each other by means of a group/common line or wiring 601B. The sensor electrode 601 is preferably formed by the strip conductors 601A and the group line or wiring 601B. The strip conductors 601A and the group line or wiring 601B thus preferably comprise a conductive surface on which capture molecules 105 can be immobilized.

The sensor electrode 601, strip conductors 601A and/or the group line or wiring 601B is/are preferably electrically connected to the first circuit unit 602 by means of a connection line or wiring 601C. The connection line or wiring 601C preferably connects the sensor electrode 601 to an input of the first circuit unit 602.

The sensor electrode 601 is preferably a first electrode 401 of a biosensor 400, as is explained by way of example in connection with FIG. 4. In principle, however, the sensor electrode 601 can also be used for detecting substances other than those described in connection with FIG. 4 and/or may have a surface finish, as described in FIG. 4 or differing therefrom, for detecting different substances, in particular molecules.

A counter electrode 601' is preferably assigned to the sensor electrode 601. The counter electrode may be constructed in a manner corresponding to, similar to and/or complementary to the sensor electrode 601. The sensor electrode 601 and the counter electrode 601' particularly preferably form the interdigital structure in that finger-like strip conductors 601A, 601'A run or extend, respectively, in an alternating manner and/or at least in portions parallel to each other. The finger-like strip conductors 601A, 601'A particularly preferably mutually engage in a finger-like manner such that a finger-like strip conductor 601A of the sensor electrode 601 runs or extends so as to be substantially in parallel with a finger-like strip conductor 601'A of the counter electrode 601' in each case. As a result, the strip conductors 601A, 601'A mutually engage in a finger-like manner, by means of which the interdigital structure can be formed.

The counter electrode 601' may comprise an optional group line or wiring 601'B. Alternatively or in addition, the counter electrode 601' comprises a connection line or wiring 601'C that is earthed for example, is or can be kept at a reference potential, or, particularly preferably, forms part of a further circuit arrangement 600', the structure of which may be similar to, may correspond to or may be identical to the structure described in connection with FIGS. 6A and 6B and the current FIG. 7.

The sensor electrode 601 is electrically coupled or connected to the first circuit unit 602. This is preferably carried out by means of the connection line or wiring 601C. In the example shown according to FIG. 7, the connection line or wiring 601C is continuously and/or directly connected or coupled to the first circuit unit 602. Therefore, unlike in the embodiment according to FIG. 6B, no switch 622 is arranged between the sensor electrode 601 and the first circuit unit 602 such that the sensor electrode 601 can be decoupled from the first circuit unit 602. Alternatively, or in addition, however, a switch 622 may also be provided, as explained in connection with FIG. 6B. The switch 622 would then be capable of selectively (alternately) connecting the first circuit unit 602 either to the sensor electrode 601 or to a reference current source 621B.

In practice, the sensor electrode 601 preferably forms an electrically conductive surface of a biosensor. In this case, the strip conductors 601A and/or the group line or wiring 601B form a surface that is electrically conductive towards the surroundings, while the remaining circuit arrangement 600 may be integrated at least substantially below the sensor electrode 601 and/or in a semiconductor material. The circuit arrangement 600 is therefore particularly preferably what is known as a system-on-chip (SoC) or a system-in-package (SiP).

The circuit arrangement 600 preferably further comprises a second circuit unit 603 and a first capacitor 604.

As already explained above, the first circuit unit 602 is designed so as to keep the electrical potential of the sensor electrode 601 in a specifiable first reference range around a specifiable target electrical potential. This may be achieved by means of the first capacitor 604 and the sensor electrode 601 being coupled such that matching of the electrical potential takes place. A preferred embodiment of this is explained in connection with FIGS. 6A and 6B, to which reference is made at this point.

The second circuit unit 603 is preferably configured such that, if the electrical potential of the first capacitor 604 is outside a second reference range, the unit detects this event and brings the first capacitor 604 to a first electrical reference potential. For details of a preferred solution in this regard, too, reference is made to the above explanation of the embodiment according to FIGS. 6A and 6B.

A connectible reference current source 621B is preferably provided at the sensor electrode 601. The reference current source 621B can impress a reference current R into the sensor electrode 601 and/or the first circuit unit 602.

The reference current R may have a positive or negative sign, and so the reference current source 621B can generate a reference current R into the sensor electrode 601 or out of the sensor electrode 601.

Very fundamentally, a reference current R is preferably a direct current, i.e. a current that is at least substantially constant in portions. Alternatively, or in addition, however, the reference current R may also comprise an alternating component or may be an alternating signal. This can be used to test the inertia of the circuit arrangement 600 by means of determining the temporal spacing at which a measurement result NI of the circuit arrangement 600 follows the reference current R.

The reference current source 621B is preferably designed to provide a known reference current R or to increase or reduce the sensor current S that flows from the sensor electrode 601 into the first circuit unit 602 by a specific, preferably known, amount. This preferably occurs when the reference current source 621B is connected to the sensor electrode 601.

In the example shown according to FIG. 7, in a manner differing from the example shown in FIG. 6B, the reference current source 621B can be connected to the sensor electrode 601 such that a reference current R is injected (impressed) into the sensor electrode 601. In the case of an intact sensor electrode 601, the reference current R is conducted into the first circuit unit 602 as the sensor current S. Alternatively or in addition, the reference current source 621B may be directly connected or connectable to the input of the first circuit unit 602 or to the connection line or wiring 601C, the sensor electrode 601 preferably not being separated from or being inseparable from the first circuit unit 602 (not shown). Alternatively, however, a switch 622 may also be provided, which switch separates the sensor electrode 601 from the first circuit unit 602 when the first circuit unit 602 is connected to the reference current source 621B directly or via the connection line or wiring 601C.

In the example shown according to FIG. 7 it is thus also possible, alternatively or in addition, to connect the reference current source 621B to the sensor electrode 601 in a parallel connection.

Within the meaning of the present invention, a current source, in particular the reference current source 621B, is connected in parallel in particular when it is coupled to the sensor electrode 601 in such a way that a (positive or negative) current is impressed into the first circuit unit 602.

In this case "in parallel" is preferably to be understood such that the reference current source 621B is connected in parallel with regard to a (virtual) ground or a reference potential for the sensor electrode 601. The reference point may also be a small signal ground or the like.

In an aspect of the present invention, which can also be implemented independently, the circuit arrangement 600 is designed and the reference current source 621B can be operationally adjusted or set such that the reference current source 621B injects into the sensor electrode 601 either no reference current R or a first reference current R having a first current strength/amperage and at least one second reference current R having a second current strength/amperage that is different from the first current strength/amperage.

In other words, the reference current source 621B is adjustable. In this case, the reference current source 621B can preferably be adjusted between different current strengths that are specified, predefined and/or known in each case.

In this case, the reference current source 621B may be continuously adjustable. However, in the example shown the reference current source 621B is adjustable in steps, preferably having at least two steps, in which the reference current source 621B delivers or injects into the sensor electrode 601 and/or the first circuit unit 602 different reference currents R, i.e., reference currents R of different current strengths.

"Injection" of the reference current R generated by the reference current source 621B means in particular that the reference current source 621B is electrically coupled to the sensor electrode 601 and/or to the first circuit unit 602, in particular is (galvanically) connected thereto, such that the reference current R that is provided by the reference current source 621B is impressed or into the conductive structure, i.e. in particular into the strip conductors 601A, the group line or wiring 601B and/or into the connection line or wiring 601C.

The adjustability of the reference current source 621B provides the advantage of precise and reliable functional testing and/or calibration. In this case, the preferred stepped adjustability of the reference current source 621B is preferably made possible by realising the relevant currents by means of individual current sources 623, 624, the currents of which are or can be specified or predefined particularly well. the currents of the current sources 623, 624 can be used in combination and as a result provide a reference current source 621B that has fewer influences, fluctuations and tolerances than a continuously adjustable reference current source 621B although the continuously adjustable source is also possible in principle.

The circuit arrangement 600 generates the measurement result M in a manner dependent on the sensor current S, i.e., the current that flows from the sensor electrode 601 into the first circuit unit 602, and particularly preferably in the form of a frequency, as explained above in particular in connection with FIGS. 6A and 6B. Therefore, in the case of a specific sensor current S, a specific measurement result M is to be anticipated or expected, in particular in a manner dependent on the capacitance of the capacitor 604.

Owing to the fact that the reference currents R injected by the reference current source 621B are known, it is possible, when the reference current source 621B is connected, to monitor the measurement result M or the frequency with regard to whether the result is as anticipated/expected. For this purpose, a range may be provided in which the measurement result M is anticipated/expected to be. If the measurement result M is outside this specified or specifiable range it is possible to conclude that a malfunction has occurred. Accordingly, the circuit arrangement 600 can be deactivated or disregarded for controlled or normal operation. In this case, controlled or normal operation is the use as a sensor, in particular a biosensor, preferably when the reference current source 621B is deactivated or electrically decoupled.

In this case, an advantage of the adjustable reference current source 621B is that it is possible to achieve twice the certainty with regard to functional testing because it is possible to monitor measurement results M for different sensor currents S generated by the reference current source 621B.

For this purpose, target values or target value ranges can be specified in each case for the reference currents R of different current strengths that are or can be injected by the reference current source 621B, in which target values or target value ranges the measurement result M is anticipated or expected to be in the case of proper functioning. If the measured value M is outside the defined range when one of the different reference currents R is injected, a fault can be identified and/or handled, in particular by deactivating the circuit arrangement 600.

Alternatively or in addition, the measurement results M, which are observed when injecting reference currents R of different magnitudes, i.e. currents having different current strengths by means of the reference current source 621, into the sensor electrode 601 and/or the connection line or wiring 601C and/or the first circuit unit 602, in particular the input thereof for the sensor electrode 601, can be used to determine behaviour, in particular a linearity, of the circuit arrangement 600 and/or to correct the measurement results M.

Alternatively, or in addition, the circuit arrangement 600 can be calibrated or able to be calibrated in this manner, i.e. by determining at least two measured values M on the basis of at least two different reference currents R that have been impressed or injected by the reference current source 621B.

For example, it is possible to create reference current/measurement result pairs and/or to assign the different reference currents R to the different measurement results M. Owing to the fact that the reference currents R are known in advance, it is possible, conversely, to assign the measurement results M to the respective reference currents R. This assignment or assignment function that is or can be determined on this basis may be used in order to reliably conclude, during subsequent controlled or normal operation (when the reference current source 621B is decoupled), the sensor currents S from measurement results M generated by a sample. For this purpose, an assignment function and/or correction function can be generated with the reference current/measurement result pairs, by means of which it is then possible to conclude the sensor currents S from the measurement results M. In this way, the relevant sensor current S can be calculated or corrected using the measurement results M.

This allows for or makes it possible to achieve an improved and/or more precise assignment of the measurement results M to a sensor current S generated at or on the sensor electrode 601 by means of biological, chemical or biochemical processes.

In other words, different reference currents R (currents of different current strengths) can be injected into the sensor electrode 601 by means of the reference current source 621B, and measurement results M that correspond to the known reference currents R can be generated and fault control, fault correction and/or calibration of the circuit arrangement 600 can be carried out using the sensor current/measurement result value pairs that result herefrom.

Preferably at least two different current sources 623, 624 are provided, which sources together form the current source 621B and/or the reference current R. In this case, at least one of the current sources 623, 624 is actuatable and/or deactivatable. Alternatively or in addition, the current sources 623, 624 are connected in parallel, such that the currents generated by the current sources 623, 624 add up to the reference current R. Depending on which of the current sources 623, 624 is activated or deactivated, it is possible, in this manner, for the reference current source 621B to generate a reference current R that is zero, or that corresponds to the current strength of the first current source 623, the current strength of the second current source 624 or the current strength of the sum of that provided by the current sources 623, 624.

In the example shown according to FIG. 7, both current sources 623, 624 are switchable by means of switches 625, 626.

In the example shown according to FIG. 7, the current sources 623, 624 are, respectively, connected in series with the switches 625, 626. This can be achieved in practice in that the current sources 623, 624 have an internal resistance (not shown). However, the current sources 623, 624 can also be designed so as to be switchable or activatable and/or deactivatable in another manner.

Together, and on account of at least one of the current sources 623, 624 being switchable, the current sources 623, 624 form a switchable and/or adjustable reference current source 621B. The adjustability of the reference current source 621B can also be achieved in another manner, however.

The (relevant) current source 623, 624 may be formed as a current mirror or may comprise a current mirror. However, other solutions are also conceivable here.

The reference current source 621B is preferably adjustable in specified or predefined steps. This can be achieved in the example shown by selectively activating none, just one, or both of the current sources 623, 624. However, other solutions for stepped adjustability of the reference current source 621B are also possible here.

It is preferable in any case for the currents or current strengths that are or can be generated by the reference current source 621B to be known or specified and/or constant.

The reference current source 621B preferably generates a reference current R that is injected into the sensor electrode 601 and/r the connection line or wiring 601C and flows as the sensor current S into the first circuit unit 602 (as measurement current).

By setting or adjusting different current strengths of the reference current R delivered by the reference current source 621B and measuring the current strengths using the circuit arrangement 600, preferably measurement results M are created that correspond to the different currents or current strengths of the reference current R. These reference current/measurement result pairs are preferably used to analyse and/or compensate the behaviour of the circuit arrangement 600 and/or to calibrate the circuit arrangement 600.

The reference current source 6219 and/or the (respective) current sources 623, 624 preferably operate at least substantially independently of a supply voltage. In particular, a voltage reference may be provided, via which a reference current R that is at least substantially independent of a supply voltage can be or is generated by the reference current source 621B or the current sources 623, 624.

The circuit arrangement 600 is preferably designed to determine, as measurement results M, electrical energy or the sensor current S, transferred from the sensor electrode 601 to the first circuit unit 602, both when the reference current source 621B is deactivated and when the source is connected.

On this basis, the circuit arrangement 600 is preferably capable of determining a short circuit of the sensor electrode 601 to another sensor electrode or a counter electrode 610'.

Alternatively, or in addition, provision is made and/or the circuit arrangement 600 is designed for determining a connection problem between the sensor electrode 601 and the first circuit unit 602 on the basis of the measurement results M. This can be achieved for example in that the measurement result M determined by the circuit arrangement 600 deviates from an anticipated or expected value or target value/region in the event of a specified, predetermined or known reference current R injected into the sensor electrode 601. In this case, a target value comparison with the measured measurement result M may be carried out, and a fault can be detected in the event of the measurement result NI deviating from the target value or from a target value range.

Figure 8:
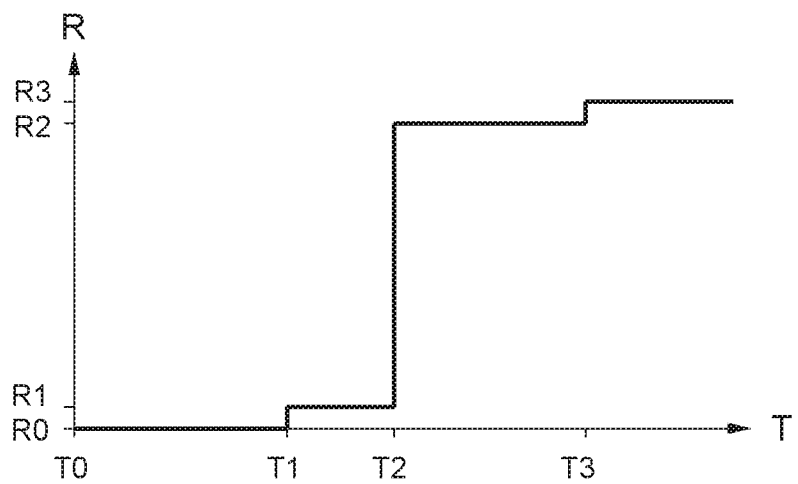
FIG. 8 is a diagram or graph in which schematically reference currents and measurement results are plotted against time.
Figure 8:
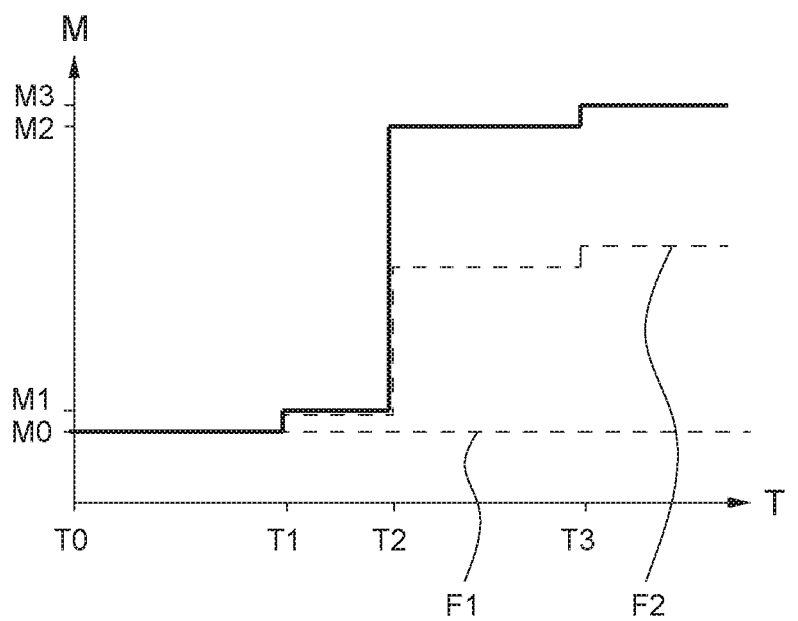

FIG. 8 shows, by way of example, a temporal progression of the reference current R and of the measurement result M, plotted over the same time T in each case.

In a first interval between a time point T0 (starting time) and a first time point T1, no reference current R is injected, and this is symbolised in FIG. 8 by R0 on the axis (y-axis) of the top diagram/graph that represents the reference current R. The reference current R, the value of which is 0, symbolised by R0 can be generated by both current sources 623, 624 being deactivated. A measurement result M0 is determined in a manner corresponding thereto and/or simultaneously. This is symbolised in the bottom diagram/graph by M0 on the axis (y-axis) representing the measurement result M. This measurement result M0 can be considered or interpreted an offset, and/or can be used to compensate for or correct measurement results M. If the measurement M0 has a value of zero, the circuit is operating in an offset-free manner, but in general a non-zero value of M0 should be assumed.

In a second interval between the first time point T1 and a second time point T2, a first reference current R1 is injected into the sensor electrode 601, the connection line or wiring 601C and/or the input of the first circuit unit 602. In the example shown, the first reference current R1 having a first current strength that is different from 0 is generated by activating just one of the current sources 623, 624 or by deactivating the other current source 623, 624. A corresponding first measurement result M1 can be determined, which result preferably deviates from the offset (measured value M0). If the first measurement result M1 does not deviate from the offset measurement result M0 or exceeds or falls below or fails to meet a target value, a fault is present or a fault is detected, since in this case the circuit arrangement 600 does not measure a reference current R injected into the sensor electrode 601. This is indicated in FIG. 8 by the dashed line F1.

Between the time point T2 and a subsequent time point T3, another, second reference current R2, i.e., a current deviating from the first reference current R1 is injected by the reference current source 621B. In this case, the reference currents R1, R2 differ at least, preferably exactly or only, in terms of the current strength thereof. A measurement result M2 corresponding to the reference current R2 is or can be determined.

The reference current R2 can be generated by a current source 623, 624 that is different from the current source 623, 624 that generates the first reference current R1. In other words, one current source 623 can generate the first reference current R1 and the other current source 624 can generate the second reference current R2.

In the example according to FIG. 8, a third reference current R3 to which a third measurement result M3 corresponds is injected after the time point T3. The third reference current R3 preferably deviates from the reference currents R1 and R2 (in terms of the current strength).

In the example shown, the reference current R3 is generated by interconnecting the respectively active current sources 623, 624, such that the currents thereof are added together.

The third reference current R3 is preferably injected into the sensor electrode 601, the connection line or wiring 601C and/or the first circuit unit 602. A third measurement result M3 corresponding thereto can be or is determined.

The reference currents R0, R1, R2, R3 preferably each differ from one another, in particular in terms of the current strength thereof. Correspondingly, this preferably also applies to the measurement results M0, M1, M2, M3.

In the example shown according to FIG. 8, a dashed line F1 is shown, according to which the measurement result M0 is always determined in a manner independent of the reference current. This is the case if the reference current R injected into the sensor electrode 601 does not have any effect on the measurement result M, for example owing to a break U1, indicated in FIG. 7, of or in the sensor electrode 601, in particular of one or more of the strip conductors 601A, the group line or wiring 601B and/or on account of a break U2, also indicated in FIG. 7, of the connection line or wiring 601C.

The fault line F2 is also shown as a dashed line in the diagram or graph according to FIG. 8, which line indicates a progression of the measurement result M when the sensor electrode 601 is short circuited to a sensor electrode 601' of another circuit arrangement 600'. This is indicated in FIG. 7 by the dashed lines K1, K2.

If the counter electrode 601' is connected to ground, the reference current R can at least substantially drain, via the short circuit in question, into and away via the counter electrode 601', such that a measurement result M as indicated by the dashed line F1 can arise.

However, the counter electrode 601' is preferably also connected to or forms part of a first circuit unit 602 of another circuit arrangement 600'.

In this case, the injected reference current R is optionally divided over two inputs of the relevant circuit arrangements 600, 600', such that the measurement result M in each case is smaller than anticipated/expected, in particular proportionally to the anticipated or expected measurement result M. This is indicated by the second fault line F2. A short circuit of the sensor electrode 601 to the sensor electrode 601' of another circuit arrangement 600' is indicated in particular if the anticipated or expected difference between the measurement result M0 without any injected reference current R and the measurement result M1, M2, M3 when a reference current R1, R2, R3 is injected corresponds to approximately half of the anticipated or expected value or target value. Accordingly, the measurement result M can be analyzed with respect to behaviour of this kind, and if necessary the corresponding fault can be detected.

The circuit arrangement 600 is preferably designed to generated corresponding reference currents R and to evaluate measurement results M generated in this case in order to determine faults and/or carry out calibration.

Calibration may be carried out for example on the assumption that the behaviour of the circuit arrangement 600 is at least substantially linear. It is to be anticipated or expected in this case that a change in the reference current R is followed by a change in the measurement result M that is proportional thereto. If the proportionality does not exist fully this can be corrected on the basis of the reference current/measurement result pairs. In this case, a correction can be made in a later measurement, for example by means of a correction function that is or can be determined in the calibration phase. The correction function can be calculated by extrapolation of the reference current/measurement result pairs.

The reference current source 621B can preferably be electrically coupled to the sensor electrode 601 by means of one or more switches 627, 628. The reference current source 621B can preferably be selectively coupled to a first portion 601D and to another, second portion 601E of the sensor electrode 601. A plurality of switches 627, 628 may be provided for this purpose. Preferably, a first switch 627 connects the reference current source 621B to the first portion 601D and/or a second switch 628 connects the reference current source 621B to the second portion 601E.

In the example shown, the first portion 601D is located in the region of the interdigital structure, in particular in the region of the strip conductors 601A and/or of the group line or wiring 601B. The second portion 601E is located in the region of the connection line or wiring 601C by means of which the strip conductors 601A and/or the group line 601B or wiring is/are connected to the first circuit unit 602. In other words, the first portion 601D is preferably located in the region of the sensor electrode 601, the conductive surface of which directly functions as biosensor, while the second portion 601E is preferably directly connected to the first circuit unit 602 by means of the connection line or wiring 601C. The second portion 601E can thus be formed by the input of the first circuit unit 602.

In the initial state, i.e., without any molecules immobilized on the surface, or in any case without a sample being in contact with the sensor electrode 601, the sensor electrode 601 preferably forms an open node via which no (direct) currents can drain away. It should therefore be assumed, in the case of correct functioning, that the reference current R passes the sensor electrode 601 unchanged and flows or is fed into the first circuit unit 602 as the sensor current S. This applies in any case for reference currents R that are provided so as to be at least substantially constant or as a direct current.

Measurement results M are preferably generated when the reference current R is alternatively injected on the one hand into the first portion 601D and on the other hand into the second portion 601E of the sensor electrode 601. Provided that the reference current R is the same, i.e., is of the same current strength, it should therefore be anticipated or expected that the same measurement result M is generated. If this is not the case, i.e., if the measurement result M is changed in a not insignificant manner depending on the portion 601D, 601E into which the reference current R is injected, it is possible to conclude that there is a contact problem between the sensor electrode 601 and the first circuit unit 602. Fault handling, which may follow, can lead to or be used for deactivation of the tested circuit arrangement 600.

The first portion 601D is preferably located in the interdigital structure of the sensor electrode 601, i.e., preferably on the strip conductors 601A and/or the group line or wiring 601B. In the example shown, galvanic contact is established between the reference current source 621B and the group line or wiring 601B if the first switch 627 establishes the connection between the reference current source 621B and the first portion 601D.

Alternatively, or in addition, in the example shown the second portion 601E is provided in the region of the connection line or wiring 601C and/or at the input of the first circuit unit 602. The second switch 626 can be used to connect the reference current source 621B to the second portion 601E. In this way, the reference current R can be injected into the second portion 601E by the reference current source 621B. However, other solutions are also possible here.

In a proposed method, in a test mode of the circuit arrangement 600 the reference current source 621B is then adjusted or set so as to inject into the sensor electrode 601 no current at a time point T0, a first reference current R having a first current strength at another time point T1, and at least one second reference current R that is different from the first and has a second current strength that is different from the first current strength at yet another time point T2. The measurement results M determined and dependent on the different injected reference currents R, in particular as described above, can be used to determine contact problems, short circuits and/or proper functioning or linearity of the circuit arrangement 600, and/or to carry out calibration, a correction function or another item of correction information for correcting measurement results M preferably being determined and preferably being used in the subsequent measurement using a sample.

In a further aspect, which can also be implemented independently, the present invention relates to a method in which a measurement result M, in particular a frequency, is generated depending on the reference current R injected into the sensor electrode 601 and/or into a sensor electrode 601' of another circuit arrangement 600', and/or depending on detected measurement results M caused thereby.

In other words, the measurement result M is determined depending on the injected reference current R, in particular in the form of a frequency that corresponds to pulses that were or can be generated in the manner described above in connection with FIGS. 6A and 6B.

A short circuit of the sensor electrode 601 to another sensor electrode 601' and/or a connection problem between the sensor electrode 601 and the first circuit unit 602 is analysed or checked or tested for or can be determined on the basis of the measurement results M. For this purpose, as already indicated above, the (relevant) measurement result M can be compared with a specification such as a target value or a target value spread or range, and a (specific) fault can be (automatically) identified in the event of a deviation from the target. Depending on the type and magnitude of the identified fault, the circuit arrangement 600 can then be deactivated. Alternatively, or in addition, another type of fault handling may be possible, for example fault correction by correcting the measurement results M or the like.

In a further aspect of the present invention, which can also be implemented independently, a reference current R is injected into each of the different portions 601D, 601E of the sensor electrode 601, preferably in succession. In this case, the first portion 601D is preferably part of the interdigital structure formed by the sensor electrode 601, while the second portion 601E is preferably provided in the region of the connection line or wiring 601C, i.e. a connection between the interdigital structure and the first circuit unit 602.

The measurement results M that are generated or can be determined when the reference current R is injected into the different portions 601D, 601E are preferably compared with one another. If the results deviate (not insignificantly) from one another, a contact problem inside the sensor electrode 601 can be detected. Accordingly, fault handling may be carried out in the event of fault identification, for example, by deactivating the (in this case tested) circuit arrangement 600.

The aspects of the present invention can be advantageously combined with one another. It is thus possible to combine and/or synchronise the switches 625, 626 and 627, 628 with one another such that, on the one hand, (preferably the same) reference current R is injected into the different portions 601D, 601E of the sensor electrode 601, and in addition, but only optionally in both portions 601D, 601E, different reference currents R (of different current strengths) are generated by the reference current source 621B and injected into the sensor electrode 601. The measurement results M that are generated or can be determined overall in this case can be used for a functional test as well as for a short circuit test and for calibration. It is thus possible to quickly achieve a high degree of functional reliability and reliability of the measurement results M by means of just a few test measurements that are easy to carry out.

The circuit arrangement 600 preferably comprises a controller 629 for controlling the reference current source 621B.

The controller 629 is preferably designed to activate, deactivate, connect individually or combine together one or more current sources 623, 624, in particular by means of the switches 625, 626, such that the currents are added together.

In the example shown, a control connection between the controller 629 and the relevant switches 623, 624 is indicated by a dashed line. In principle, adjustability of the relevant current source 623, 624 can, however, also be achieved in another manner, for example by means of the controller 629 changing a control signal or control current or a reference voltage for the relevant current source 623, 624.

Alternatively, or in addition, the controller 629 is designed to control the reference current source 621B such that the source is or can be connected either to the first portion 601D or to the second portion 601E of the sensor electrode 601.

In the example shown, the controller 629 controls one or more of the switches 627, 628 such that the reference current R is injected into the first portion 601D or into the second portion 601E. For this purpose, as indicated in FIG. 7 by the dashed line, the controller 629 can control the switches 627, 628 such that a connection is established or broken, such that the reference current R is injected either into the first portion 601D or into the second portion 601E.

It is in principle also possible for the reference current R to be injected into both portions 601D, 601E simultaneously. Moreover, a further alternative is conceivable in which the switch 627 is replaced by a through-connection, and only the switch 628 is controlled. If the measurement results M deviate depending on whether the reference current R is injected only into the first portion 601D or also into the second portion 601E, a fault, for example a contact problem, can therefore be identified.

The controller 629 is preferably designed to control the current sources 623, 624 and/or switches 625, 626, 627, 628 in such a way that the proposed method is carried out.

Furthermore, the controller 629 can receive the measurement result M and compare the result with a specification or target. The specification or target may result from or correspond to control commands that the controller 629 uses to control the reference current source 621B.

The controller 629 can also be designed to carry out calibration, in particular to generate a calibration function. This may be a function that assigns measurement results M to respective sensor currents S or corrects an assignment or function of this kind.

The different aspects of the present invention may be implemented individually and in various combinations. The proposed testing method (for fault identification, in particular identification of a short circuit or a break) can thus also be carried out separately from calibration and vice versa. However, the combination thereof is particularly preferred, since in this case both calibration and functional testing can be carried out simultaneously, in particular on the basis of the same measurement results M, and in a synergistic manner using just a few method steps and necessary means.

What is claimed is:

1. A method for at least one of testing and calibrating a circuit arrangement, comprising
    a sensor electrode, a first circuit unit that is electrically coupled to the sensor electrode, and a second circuit unit that comprises a first capacitor, the first circuit unit being configured so as to keep the electrical potential of the sensor electrode in a specifiable first reference range around a specifiable target electrical potential by means of the first capacitor and the sensor electrode being coupled such that matching of the electrical potential is made possible, the second circuit unit being configured such that, if the electrical potential of the first capacitor is outside a second reference range, the second circuit unit detects this event and brings the first capacitor to a first electrical reference potential, and a connectible reference current source being provided at the sensor electrode, the reference current source providing a known reference current when the reference current source is connected to the sensor electrode,
    wherein the method comprises at least one of the following steps:
    adjusting the reference current source so as to inject into the sensor electrode no current as well as a first reference current having a first current strength and at least one second reference current having a second current strength that is different from the first current strength;
    generating and analyzing a measurement result in a manner dependent on which reference current is injected into at least one of the sensor electrode and a sensor electrode of another circuit arrangement in order to determine at least one of a short circuit of the sensor electrode and a connection problem between the sensor electrode and the first circuit unit, at least one of a short circuit of the sensor electrode and a connection problem between the sensor electrode and the first circuit unit being determined from the measurement results; and
    the injected reference current is injected by the reference current source into a first portion and into another, second portion of the sensor electrode.

2. The method according to claim 1, wherein the first portion forms part of an interdigital structure and the second portion is provided in the region of a connection line or wiring between the interdigital structure and the first circuit unit.

3. The method according to claim 1, wherein the reference current source is adjusted in predefined steps, such that the reference current source injects specific, predefined reference currents into the sensor electrode.

4. The method according to claim 1, wherein the circuit arrangement generates a measurement result depending on at least one of the reference current injected into the sensor electrode and the detected events caused thereby.

5. The method according to claim 4, wherein, for the purpose of a linearity test, a plurality of different, in each case known, reference currents are injected into the sensor electrode by the reference current source, a linearity or deviation from a proportional dependency of the measurement results of the overall injected reference current being determinable or determined on the basis of the measurement results.

6. The method according to claim 4, wherein the measurement result determined when the reference current source is switched off is used to identify a short circuit.

7. The method according to claim 4, wherein the measurement result determined when the reference current source is switched on is used to check at least one of contacting and formation of an interdigital structure.

8. The method according to claim 4, wherein a plurality of different, in each case known, reference currents are injected into the sensor electrode by the reference current source, measurement results that correspond to the reference currents are determined by the circuit arrangement, a comparison of the measurement results with target values is carried out, and calibration of the circuit arrangement in order to correct the measurement results is carried out on the basis of said comparison.

9. The method according to claim 4, wherein the measurement result in the case of reference current injected into the first portion is compared with the measurement result in the case of reference current injected into the second portion in order to verify the contacting of an interdigital structure.

10. The method according to claim 9, wherein, in the event of the same injected reference currents in the different portions, a deviation in the measurement results above a threshold is classified as an indicator for faulty contacting, such that the circuit arrangement can be deactivated or ignored during an evaluation.

11. The method according to claim 4, wherein a plurality of circuit arrangements are provided, the sensor electrodes of which form a common interdigital structure, and wherein a reference current is injected into the sensor electrode of one of the circuit arrangements by the reference current source and the measurement result of the other of the circuit arrangements is used to check the circuit arrangements for insulation or a short circuit between the sensor electrodes.

12. Circuit arrangement, comprising:
    a sensor electrode,
    a first circuit unit that is electrically coupled to the sensor electrode, and
    a second circuit unit that comprises a first capacitor;
    wherein the first circuit unit is configured so as to keep the electrical potential of the sensor electrode in a specifiable first reference range around a specifiable target electrical potential by the first capacitor and the sensor electrode being coupled such that matching of the electrical potential is possible;

wherein the second circuit unit is configured such that, if the electrical potential of the first capacitor is outside a second reference range, the second circuit unit detects this event and brings the first capacitor to a first electrical reference potential, and wherein a connectible reference current source is provided at the sensor electrode, the reference current source providing a known reference current when the reference current source is connected to the sensor electrode, such that the reference current is injected into at least one of the sensor electrode and said circuit unit, and wherein the circuit arrangement has at least one of the following features:

the circuit arrangement being configured and the reference current source being adjustable such that reference current source injects into the sensor electrode no reference current as well as a first reference current having a first current strength and at least one second reference current having a second current strength that is different from the first current strength;

the circuit arrangement being configured to determine electrical energy transmitted from the sensor electrode to the first circuit unit, both when the reference current source is deactivated and when said source is connected, as measurement results, such that at least one of a short circuit of the sensor electrode and a connection problem between the sensor electrode and the first circuit unit can be determined from the measurement results; and the reference current source being selectively connectable to a first portion and to another, second portion of the sensor electrode, such that the reference current is injected into the first portion or into the second portion, wherein the first portion forms part of an interdigital structure and the second portion is provided in the region of a connection line or wiring between the interdigital structure and the first circuit unit.

13. Circuit arrangement according to claim 12, wherein the reference current source is adjustable in predefined or specified steps.

14. Circuit arrangement according to claim 12, wherein the reference current source comprises at least two current sources that can be activated and deactivated separately from one another and which, respectively, inject no reference current in the deactivated state and inject a predefined or specified reference current in the activated state.

15. Circuit arrangement according to claim 14, wherein the current sources are interconnected such that the reference currents thereof are injected or injectable into the sensor electrode in a manner added so as to form the reference current.

16. Circuit arrangement according to claim 14, wherein the current sources comprise a stabilizing circuit for generating a reference current that is at least substantially independent of a supply voltage.

17. Circuit arrangement according to claim 14, wherein the circuit arrangement is configured to generate a measurement result on the basis of the reference current injected into the sensor electrode.

18. Circuit arrangement according to claim 17, wherein the measurement result can be determined by means of a counting element that is electrically coupled to the second circuit unit and is configured to count at least one of the number and the temporal sequence of the detected results.

19. Circuit arrangement according to claim 18, wherein the measurement result has or is formed by the count value or a frequency determined thereby.

20. A method for at least one of testing and calibrating a circuit arrangement, comprising a sensor electrode, a first circuit unit that is electrically coupled to the sensor electrode, and a second circuit unit that comprises a first capacitor, the first circuit unit being configured so as to keep the electrical potential of the sensor electrode in a specifiable first reference range around a specifiable target electrical potential by means of the first capacitor and the sensor electrode being coupled such that matching of the electrical potential is made possible, the second circuit unit being configured such that, if the electrical potential of the first capacitor is outside a second reference range, the unit detects this event and brings the first capacitor to a first electrical reference potential, and a connectible reference current source being provided at the sensor electrode, the reference current source providing a known reference current when the reference current source is connected to the sensor electrode, wherein the method comprises generating and analyzing a measurement result in a manner dependent on a reference current injected into at least one of the sensor electrode and a sensor electrode of another circuit arrangement in order to determine at least one of a short circuit of the sensor electrode and a connection problem between the sensor electrode and the first circuit unit, at least one of a short circuit of the sensor electrode and a connection problem between the sensor electrode and the first circuit unit being determined from the measurement results.

* * * * *